(12) United States Patent
Park et al.

(10) Patent No.: US 11,380,657 B2
(45) Date of Patent: Jul. 5, 2022

(54) DISPLAY DEVICE USING SEMICONDUCTOR LIGHT-EMITTING ELEMENT AND MANUFACTURING METHOD THEREFOR

(71) Applicant: LG ELECTRONICS INC., Seoul (KR)

(72) Inventors: Changseo Park, Seoul (KR); Bongchu Shim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/966,729

(22) PCT Filed: Feb. 1, 2018

(86) PCT No.: PCT/KR2018/001381
§ 371 (c)(1),
(2) Date: Jul. 31, 2020

(87) PCT Pub. No.: WO2019/151550
PCT Pub. Date: Aug. 8, 2019

(65) Prior Publication Data
US 2020/0365567 A1    Nov. 19, 2020

(51) Int. Cl.
*H01L 29/18* (2006.01)
*H01L 33/00* (2010.01)
(Continued)

(52) U.S. Cl.
CPC .......... *H01L 25/0753* (2013.01); *H01L 24/32* (2013.01); *H01L 33/62* (2013.01);
(Continued)

(58) Field of Classification Search
CPC ..... H01L 25/0753; H01L 24/32; H01L 33/62; H01L 33/0093; H01L 2224/32227;
(Continued)

(56) References Cited

U.S. PATENT DOCUMENTS

2012/0001889 A1    1/2012   Kimura
2015/0255439 A1*   9/2015   Kim ................... H01L 25/0753
                                                           257/89
(Continued)

FOREIGN PATENT DOCUMENTS

EP         3 270 413 A1      1/2018
KR    10-2012-0135528 A     12/2012
(Continued)

*Primary Examiner* — Ismail A Muse
(74) *Attorney, Agent, or Firm* — Birch, Stewart, Kolasch & Birch, LLP

(57) ABSTRACT

Discussed is a display device comprising a substrate; a plurality of cells provided with a partition wall protruding on the substrate, and sequentially arranged along one direction; a plurality of semiconductor light-emitting elements respectively accommodated in the plurality of cells; and a first electrode provided with a plurality of electrode lines arranged on a bottom of the plurality of cells, and electrically connected to the plurality of semiconductor light-emitting elements, wherein the bottom of the plurality of cells comprise a first region covered by the plurality of electrode lines, and a second region formed between the plurality of electrode lines.

21 Claims, 15 Drawing Sheets

(51) Int. Cl.
 *H01L 25/075* (2006.01)
 *H01L 23/00* (2006.01)
 *H01L 33/62* (2010.01)

(52) U.S. Cl.
 CPC *H01L 33/0093* (2020.05); *H01L 2224/32227* (2013.01); *H01L 2933/0066* (2013.01)

(58) Field of Classification Search
 CPC . H01L 2933/0066; H01L 33/38; H01L 27/15; H01L 27/156
 See application file for complete search history.

(56) References Cited

U.S. PATENT DOCUMENTS

| | | | |
|---|---|---|---|
| 2016/0240517 A1* | 8/2016 | Kim | ............... H01L 25/0753 |
| 2017/0133550 A1 | 5/2017 | Schuele et al. | |
| 2017/0170152 A1* | 6/2017 | Wi | ............... G06F 1/1652 |
| 2017/0200765 A1 | 7/2017 | Choi et al. | |
| 2018/0019369 A1 | 1/2018 | Cho et al. | |
| 2019/0305197 A1* | 10/2019 | Yamada | ............... H01L 33/60 |
| 2020/0091376 A1 | 3/2020 | Lim et al. | |

FOREIGN PATENT DOCUMENTS

| | | |
|---|---|---|
| KR | 10-2014-0039606 A | 4/2014 |
| KR | 10-2014-0101602 A | 8/2014 |
| KR | 10-2016-0116550 A | 10/2016 |
| WO | 3 182 470 A1 | 6/2017 |
| WO | WO 2017/122891 A1 | 7/2017 |
| WO | WO 2017/150910 A1 | 9/2017 |

\* cited by examiner

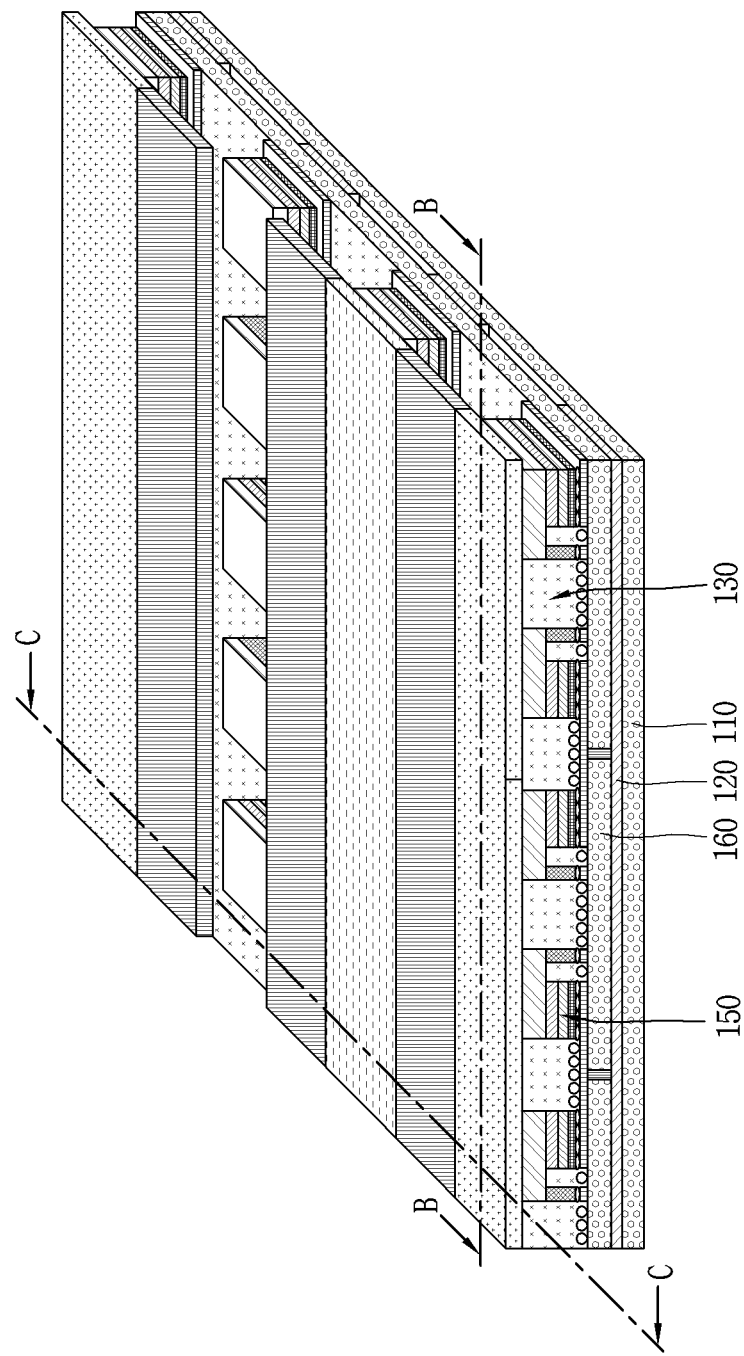

DISPLAY DEVICE USING SEMICONDUCTOR LIGHT-EMITTING ELEMENT AND MANUFACTURING METHOD THEREFOR

CROSS REFERENCE TO RELATED APPLICATIONS

This application is the National Stage filing under 35 U.S.C. 371 of International Application No. PCT/KR2018/001381 filed on Feb. 1, 2018, which is hereby expressly incorporated by reference into the present application.

BACKGROUND

1. Technical Field

The present disclosure relates to a display device and a manufacturing method thereof, and more particularly, to a display device using a semiconductor light-emitting element.

2. Description of the Related Art

In recent years, display devices having excellent characteristics such as low profile, flexibility and the like have been developed in the display technical field. On the contrary, currently commercialized main displays are represented by liquid crystal displays (LCDs) and active matrix organic light-emitting diodes (AMOLEDs).

However, there exist problems such as not-so-fast response time, difficult implementation of flexibility in case of LCDs, and there exist drawbacks such as short life span, not-so-good yield as well as weakness in flexibility in case of AMOLEDs.

On the other hand, light-emitting diodes (LEDs) are well known light-emitting elements for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light-emitting elements may be used to implement a flexible display, thereby presenting a scheme for solving the problems.

However, in case of a display using semiconductor light-emitting elements, it is difficult to implement a large-sized display device. Accordingly, a manufacturing process capable of implementing a large-screen display device in a display using semiconductor light-emitting elements may be devised.

SUMMARY

An aspect of the present disclosure is to implement a display device having a new structure.

Another aspect of the present disclosure is to provide a new manufacturing process for implementing a display device.

Still another aspect of the present disclosure is to provide a new manufacturing process capable of reducing transfer processes and improving transfer precision in the process of transferring grown semiconductor light-emitting elements to a wiring substrate.

A display device according to the present disclosure may include a substrate; a plurality of cells provided with a partition wall protruding on the substrate, and sequentially arranged along one direction; a semiconductor light-emitting element accommodated in each of the plurality of cells; and a first electrode provided with a plurality of electrode lines arranged on the bottom of each of the cells, and electrically connected to the semiconductor light-emitting element, wherein the bottom of each of the cells comprises a first region covered by the plurality of electrode lines, and a second region formed between the electrode lines.

According to an embodiment, the substrate may further include a dielectric layer to allow the first electrode to form an electric field with an external electrode.

According to an embodiment, the electric field may be formed in each of the cells through the second region formed between the electrode lines.

According to an embodiment, the partition wall provided in the cells may be formed to cover at least part of the first electrode disposed in each of the cells.

According to an embodiment, the partition wall may be made of a polymer material, and the electric field may be formed inside each of the cells by the partition wall.

According to an embodiment, at least part of the partition wall may be formed to cover at least part of the first electrode, and the remaining part of the partition wall may be formed to cover the dielectric layer.

According to an embodiment, the second region may be provided with at least one slit, and the at least one slit may be partitioned by the plurality of electrode lines provided on the first electrode.

According to an embodiment, the semiconductor light-emitting element accommodated in each of the cells may include a first conductive electrode and a second conductive electrode; a first conductive semiconductor layer on which the first conductive electrode is disposed; a second conductive semiconductor layer that overlaps with the first conductive semiconductor layer, on which the second conductive electrode is disposed; and an active layer disposed between the first and second conductive semiconductor layers, wherein the first conductive electrode is disposed to face the first electrode.

According to an embodiment, the semiconductor light-emitting element may be accommodated in the cells by an electric field formed by the first electrode and the external electrode.

According to an embodiment, in an embodiment disposed on at least part of the second conductive electrode to extend in a direction crossing the first electrode, the substrate may include one surface and the other surface, and the first electrode may be provided on one surface of the substrate, and a third electrode may be provided on the other surface of the substrate, and a via hole passing through the substrate may be formed on one side of the substrate.

According to an embodiment, the second electrode and the second conductive electrode may be electrically connected to the third electrode through the via hole.

According to an embodiment, the substrate may include one surface and the other surface, and the first electrode may be provided on one surface of the substrate, and a third electrode may be provided on the other surface of the substrate, and an electric field may be formed by the first electrode and the third electrode in each of the cells.

According to an embodiment, the plurality of cells may be arranged in a matrix structure, and the plurality of electrode lines may extend to neighboring cells.

According to an embodiment, an insulating material may be filled between the partition wall and the semiconductor light-emitting element.

In a display device according to the present disclosure, a semiconductor light-emitting element may be transferred using an electric field formed through a wiring electrode to assemble the semiconductor light-emitting element in place, thereby improving assembly efficiency.

Furthermore, in a display device according to the present disclosure, red, green, and blue semiconductor light-emitting elements may be selectively transferred using an electric field without an additional masking process, thereby improving transfer process efficiency.

BRIEF DESCRIPTION OF THE DRAWINGS

FIG. 2 is a partial enlarged view of portion "A" in FIG. 1, and FIGS. 3A and 3B are cross-sectional views taken along lines B-B and C-C in FIG. 2.

DETAILED DESCRIPTION OF THE EMBODIMENTS

Figure 1:
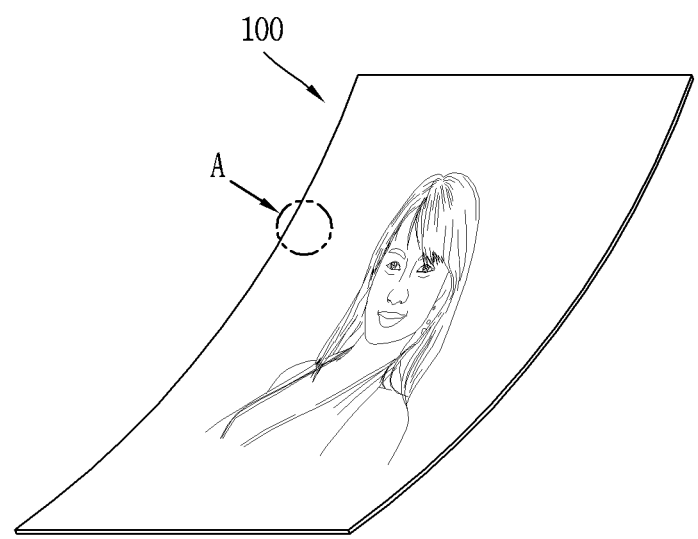
FIG. 1 is a conceptual view showing a display device using a semiconductor light-emitting element according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing an embodiment disclosed herein, moreover, the detailed description will be omitted when specific description for publicly known technologies to which the invention pertains is judged to obscure the gist of the present disclosure. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view showing a display device using a semiconductor light-emitting element according to an embodiment of the present disclosure.

According to the drawing, information processed in the controller of the display device 100 may be displayed using a flexible display.

The flexible display may include a flexible, bendable, twistable, foldable and rollable display. For example, the flexible display may be a display manufactured on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated, information displayed in the second configuration may be visual information displayed on a curved surface. The visual information may be implemented by individually controlling the light emission of sub-pixels disposed in a matrix form. The sub-pixel denotes a minimum unit for implementing one color.

The sub-pixel of the flexible display may be implemented by a semiconductor light-emitting element. According to the present disclosure, a light-emitting diode (LED) is illustrated as a type of semiconductor light-emitting element. The light-emitting diode may be formed with a small size to perform the role of a sub-pixel even in the second configuration through this.

Hereinafter, a flexible display implemented using the light-emitting diode will be described in more detail with reference to the accompanying drawings.

Figure 3A:
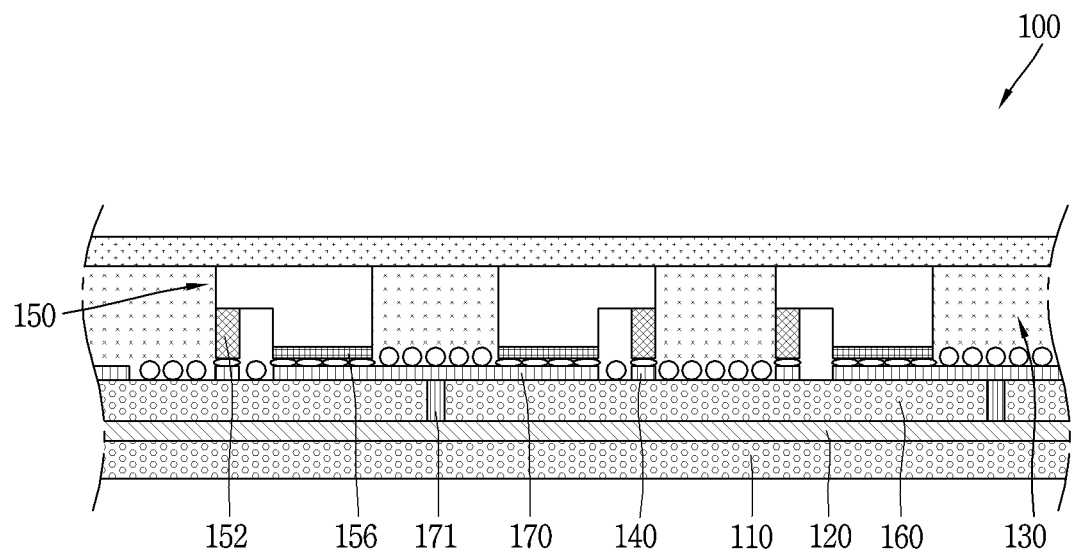
Figure 3B:
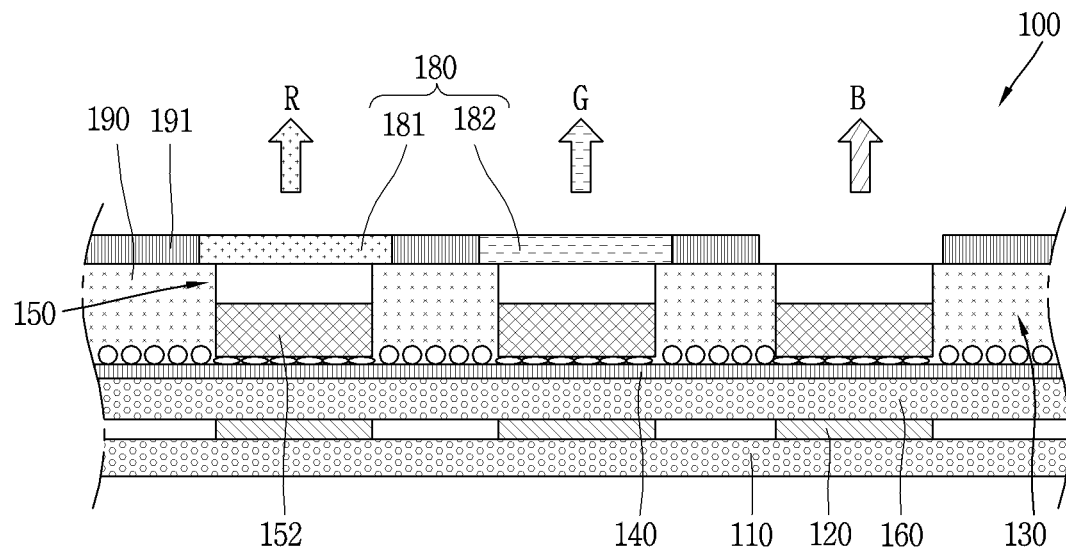
Figure 4:
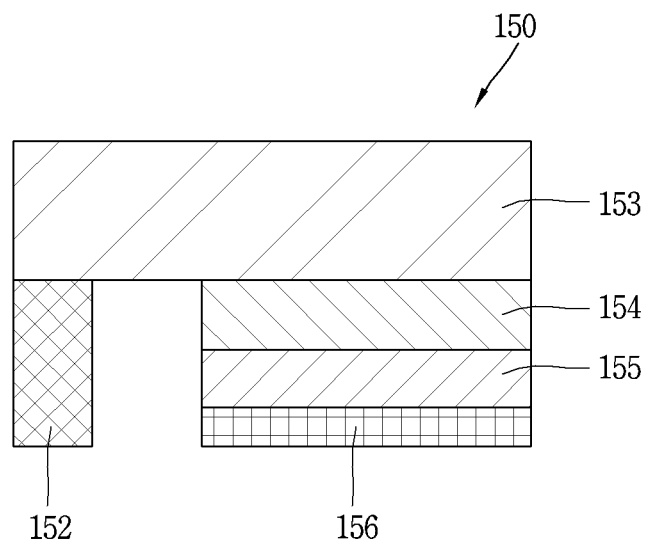
FIG. 4 is a conceptual view showing a flip-chip type semiconductor light-emitting element in FIG. 3.

FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light-emitting element in FIG. 3A, and FIGS. 5A through 5C are conceptual views illustrating various forms for implementing colors in connection with a flip-chip type semiconductor light-emitting element.

According to the drawings in FIGS. 2, 3A and 3B, there is illustrated a display device 100 using a passive matrix (PM) type semiconductor light-emitting element as a display device 100 using a semiconductor light-emitting element.

However, an example described below may also be applicable to an active matrix (AM) type semiconductor light-emitting element.

The display device 100 may include a substrate 110, a first electrode 120, a conductive adhesive layer 130, a second electrode 140, and a plurality of semiconductor light-emitting elements 150.

The substrate 110 may be a flexible substrate. The substrate 110 may contain glass or polyimide (PI) to implement the flexible display device. In addition, if it is an insulating and flexible material, any one such as polyethylene naphthalate (PEN), polyethylene terephthalate (PET) or the like may be used. Furthermore, the substrate 110 may be either one of transparent and non-transparent materials.

The substrate 110 may be a wiring substrate disposed with the first electrode 120, and thus the first electrode 120 may be placed on the substrate 110.

According to the drawing, an insulating layer 160 may be disposed on the substrate 110 placed with the first electrode 120, and an auxiliary electrode 170 may be placed on the insulating layer 160. In this case, a configuration in which the insulating layer 160 is deposited on the substrate 110 may be a single wiring substrate. More specifically, the insulating layer 160 may be incorporated into the substrate 110 with an insulating and flexible material such as polyimide (PI), PET, PEN or the like to form a single wiring substrate.

The auxiliary electrode 170 as an electrode for electrically connecting the first electrode 120 to the semiconductor light-emitting element 150 is placed on the insulating layer 160, and disposed to correspond to the location of the first electrode 120. For example, the auxiliary electrode 170 has a dot shape, and may be electrically connected to the first electrode 120 by means of an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the present disclosure may not be necessarily limited to this. For example, it may be possible to also have a structure in which the conductive adhesive layer 130 is disposed on the substrate 110 with no insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display device.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by means of the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. According to the drawing, in the present example, the anisotropic conductive film is a film with a form in which an anisotropic conductive medium is mixed with an insulating base member, and thus when heat and pressure are applied thereto, only a specific portion thereof may have conductivity by means of the conductive balls. The anisotropic conductive film may be in a state in which a core with a conductive material contains a plurality of particles coated by an insulating layer with a polymer material, and in this case, it may have conductivity by means of the core while breaking an insulating layer on a portion to which heat and pressure are applied. Here, a core may be transformed to implement a layer having both surfaces to which objects contact in the thickness direction of the film. For a more specific example, heat and pressure are applied to an anisotropic conductive film as a whole, and electrical connection in the z-axis direction is partially formed by a height difference from a mating object adhered by the use of the anisotropic conductive film.

For another example, an anisotropic conductive film may be in a state containing a plurality of particles in which a conductive material is coated on insulating cores. In this case, a portion to which heat and pressure are applied may be converted (pressed and adhered) to a conductive material to have conductivity in the thickness direction of the film. For still another example, it may be formed to have conductivity in the thickness direction of the film in which a conductive material passes through an insulating base member in the z-direction. In this case, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure may not be necessarily limited to this, and the anisotropic conductive film may be all allowed to have a form in which conductive balls are randomly mixed with an insulating base member or a form configured with a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring again to the drawing, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed in a state that the auxiliary electrode 170 and second electrode 140 are located, and then the semiconductor light-emitting element 150 is connect thereto in a flip chip form with the application of heat and pressure, the semiconductor light-emitting element 150 is electrically connected to the first electrode 120 and second electrode 140.

Referring to FIG. 4, the semiconductor light-emitting element may be a flip chip type semiconductor light-emitting element.

For example, the semiconductor light-emitting element may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this case, the p-type electrode 156 may be electrically connected to the welding portion 179 by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light-emitting elements 150. For example, the left and right p-type electrodes of the semiconductor light-emitting elements around the auxiliary electrode may be electrically connected to one auxiliary electrode.

More specifically, the semiconductor light-emitting element 150 is pressed into the conductive adhesive layer 130, and through this, only a portion between the p-type electrode 156 and auxiliary electrode 170 of the semiconductor light-emitting element 150 and a portion between the n-type electrode 152 and second electrode 140 of the semiconductor light-emitting element 150 have conductivity, and the remaining portion does not have conductivity since there is no push-down of the semiconductor light-emitting element. As described above, the conductive adhesive layer 130 may form an electrical connection as well as allow a mutual coupling between the semiconductor light-emitting element 150 and the auxiliary electrode 170 and between the semiconductor light-emitting element 150 and the second electrode 140.

Furthermore, a plurality of semiconductor light-emitting elements 150 constitute a light-emitting array, and a phosphor layer 180 is formed on the light-emitting array.

The light-emitting element array may include a plurality of semiconductor light-emitting elements with different self-luminance values. Each of the semiconductor light-emitting elements 150 constitutes a sub-pixel, and is electrically connected to the first electrode 120. For example, there may exist a plurality of first electrodes 120, and the semiconductor light-emitting elements are arranged in several rows, for instance, and each row of the semiconductor light-emitting elements may be electrically connected to any one of the plurality of first electrodes.

Furthermore, the semiconductor light-emitting elements may be connected in a flip chip form, and thus semiconductor light-emitting elements grown on a transparent dielectric substrate. Furthermore, the semiconductor light-emitting elements may be nitride semiconductor light-emitting elements, for instance. The semiconductor light-emitting element 150 may have excellent luminance characteristics, and thus it may be possible to configure individual sub-pixels even with a small size thereof.

According to the drawing, a partition wall 190 may be formed between the semiconductor light-emitting elements 150. The semiconductor light-emitting element 150 may have excellent luminance characteristics, and thus it may be possible to configure individual sub-pixels even with a small size thereof. For example, a base member of the anisotropic conductive film may form the partition wall when the semiconductor light-emitting element 150 is inserted into the anisotropic conductive film.

Furthermore, when the base member of the anisotropic conductive film is black, the partition wall 190 may have reflective characteristics while at the same time increasing contrast with no additional black insulator.

For another example, a reflective partition wall may be separately provided with the partition wall 190. In this case, the partition wall 190 may include a black or white insulator according to the purpose of the display device. When a partition wall of a white insulator is used, an effect of enhancing reflectivity may be obtained. When a partition wall of a black insulator is used, a contrast ratio may be increased while having a reflection characteristic.

The phosphor layer 180 may be located at an outer surface of the semiconductor light-emitting element 150. For example, the semiconductor light-emitting element 150 is a blue semiconductor light-emitting element that emits blue (B) light, and the phosphor layer 180 performs the role of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light-emitting element 151 at a position implementing a red sub-pixel, and a green phosphor 182 capable of converting blue light into green (G) light may be deposited on the blue semiconductor light-emitting element 151 at a position implementing a green sub-pixel. Furthermore, only the blue semiconductor light-emitting element 151 may be solely used at a location implementing a blue sub-pixel. In this case, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed along the second electrode 140, thereby implementing sub-pixels.

However, the present disclosure may not be necessarily limited to this, and the semiconductor light-emitting element 150 may be combined with quantum dot (QD) instead of phosphor to implement sub-pixels such as red (R), green (G) and blue (B).

Furthermore, a black matrix 191 may be disposed between each phosphor layer to enhance contrast. In other words, the black matrix 191 can enhance the contrast of luminance.

However, the present disclosure may not be necessarily limited to this, and another structure for implementing blue, red and green may be also applicable thereto.

Figure 5A:
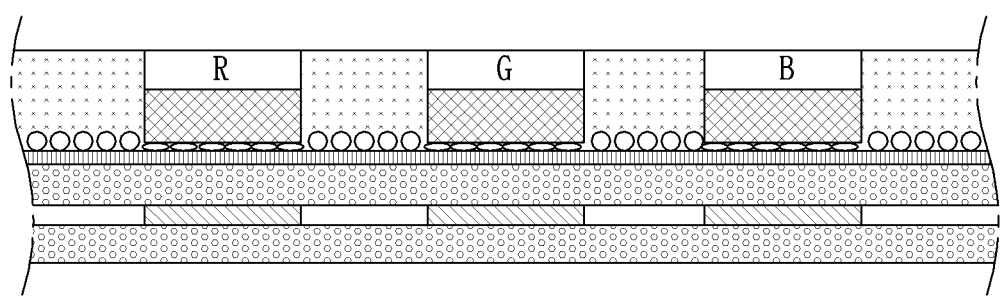
FIGS. 5A through 5C are conceptual views illustrating various forms for implementing colors in connection with a flip-chip type semiconductor light-emitting element.

Referring to FIG. 5A, each of the semiconductor light-emitting elements 150 may be implemented with a high-power light-emitting element that emits various lights including blue in which gallium nitride (GaN) is mostly used, and indium (In) and or aluminum (Al) are added thereto.

In this case, the semiconductor light-emitting element 150 may be red, green and blue semiconductor light-emitting elements, respectively, to implement each sub-pixel. For instance, red, green and blue semiconductor light-emitting elements (R, G, B) are alternately disposed, and red, green and blue sub-pixels implement one pixel by means of the red, green and blue semiconductor light-emitting elements, thereby implementing a full color display.

Figure 5B:
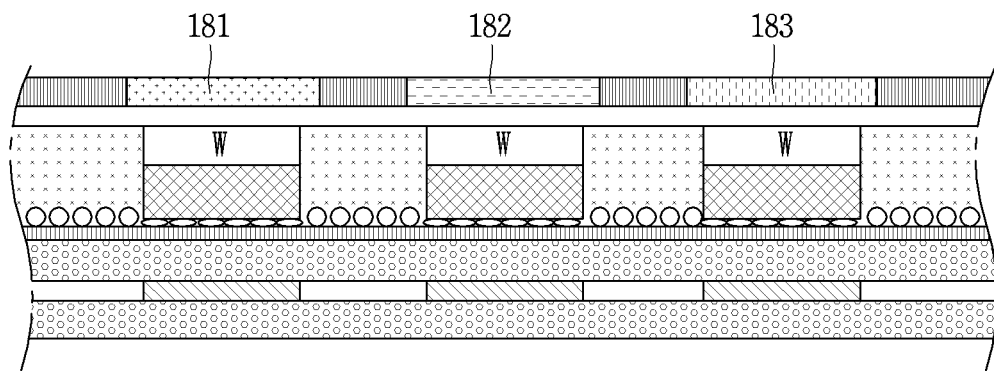

Referring to FIG. 5B, the semiconductor light-emitting element may have a white light-emitting element (W) provided with a yellow phosphor layer for each element. In this case, a red phosphor layer 181, a green phosphor layer 182 and blue phosphor layer 183 may be provided on the white light-emitting element (W) to implement a sub-pixel. Furthermore, a color filter repeated with red, green and blue on the white light-emitting element (W) may be used to implement a sub-pixel.

Figure 5C:
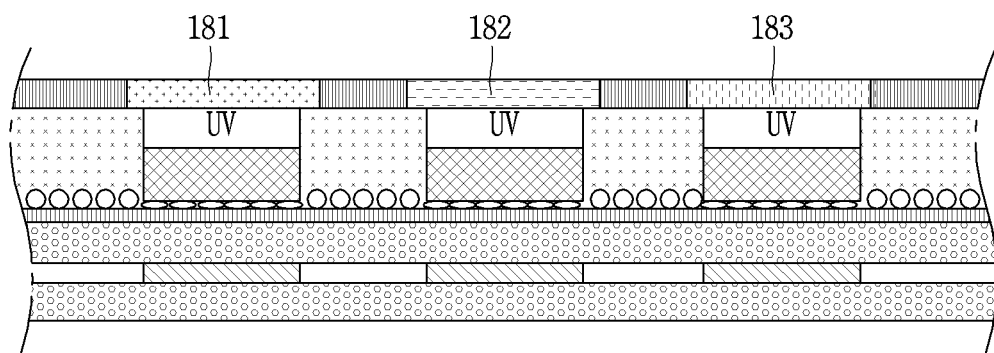

Referring to FIG. 5C, it may be possible to also have a structure in which a red phosphor layer 181, a green phosphor layer 182 and blue phosphor layer 183 may be provided on a ultra violet light-emitting element (UV). In this manner, the semiconductor light-emitting element can be used over the entire region up to ultra violet (UV) as well as visible light, and may be extended to a form of semiconductor light-emitting element in which ultra violet (UV) can be used as an excitation source.

Taking the present example into consideration again, the semiconductor light-emitting element 150 is placed on the conductive adhesive layer 130 to constitute a sub-pixel in the display device. The semiconductor light-emitting element 150 may have excellent luminance characteristics, and thus it may be possible to configure individual sub-pixels even with a small size thereof. The size of the individual semiconductor light-emitting element 150 may be less than 80 µm in the length of one side thereof, and formed with a rectangular or square shaped element. In case of a rectangular shaped element, the size thereof may be less than 20×80 µm.

Furthermore, even when a square shaped semiconductor light-emitting element 150 with a length of side of 10 µm is used for a sub-pixel, it will exhibit a sufficient brightness for implementing a display device. Accordingly, for example, in case of a rectangular pixel in which one side of a sub-pixel is 600 µm in size, and the remaining one side thereof is 300 µm, a relative distance between the semiconductor light-emitting elements becomes sufficiently large. Accordingly, in this case, it may be possible to implement a flexible display device having a HD image quality.

A display device using the foregoing semiconductor light-emitting element will be manufactured by a new type of manufacturing method. Hereinafter, the manufacturing method will be described with reference to FIG. 6.

Figure 6:
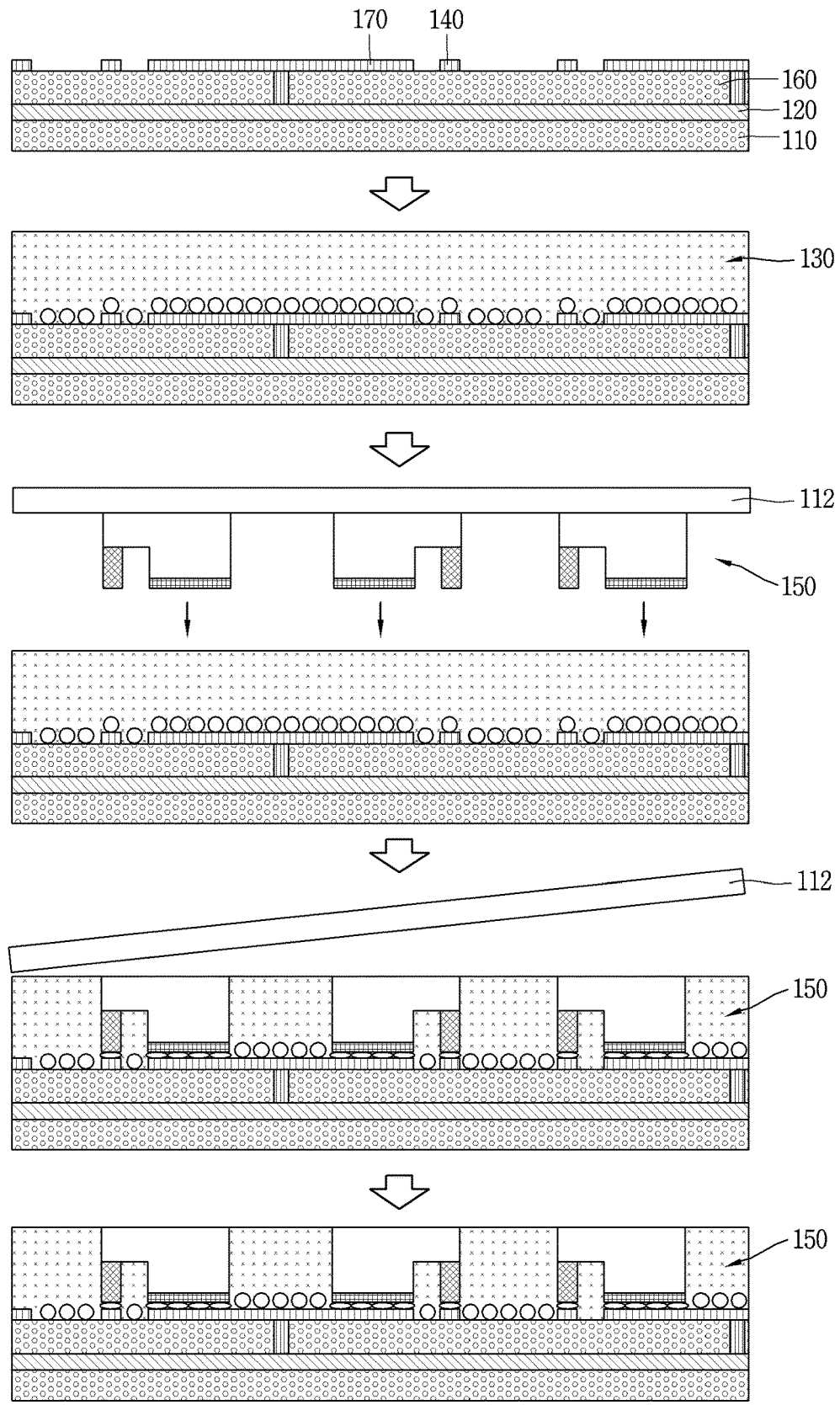
FIG. 6 is cross-sectional views showing a manufacturing method of a display device using a semiconductor light-emitting element according to the present disclosure.

FIG. 6 is cross-sectional views showing a manufacturing method of a display device using a semiconductor light-emitting element according to the present disclosure.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In this case, the first electrode 120 and second electrode 140 may be disposed in a perpendicular direction to each other. Furthermore, the first substrate 110 and insulating layer 160 may contain glass or polyimide (PI), respectively, to implement a flexible display device.

The conductive adhesive layer 130 may be implemented by an anisotropic conductive film, for example, and to this end, an anisotropic conductive film may be coated on a substrate located with the insulating layer 160.

Next, a second substrate 112 located with a plurality of semiconductor light-emitting elements 150 corresponding to the location of the auxiliary electrodes 170 and second electrodes 140 and constituting individual pixels is disposed such that the semiconductor light-emitting element 150 faces the auxiliary electrode 170 and second electrode 140.

In this case, the second substrate 112 as a growth substrate for growing the semiconductor light-emitting element 150 may be a sapphire substrate or silicon substrate.

The semiconductor light-emitting element may have a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light-emitting element 150 and the auxiliary electrode 170 and second electrode 140 may have conductivity due to the characteristics of an anisotropic conductive film having conductivity by thermal compression, thereby allowing the electrodes and semiconductor light-emitting element 150 to be electrically connected to each other. At this time, the semiconductor light-emitting element 150 may be inserted into the anisotropic conductive film, thereby forming a partition wall between the semiconductor light-emitting elements 150.

Next, the second substrate 112 is removed. For example, the second substrate 112 may be removed using a laser lift-off (LLO) or chemical lift-off (CLO) method.

Finally, the second substrate 112 is removed to expose the semiconductor light-emitting elements 150 to the outside. Silicon oxide (SiOx) or the like may be coated on the wiring substrate coupled to the semiconductor light-emitting element 150 to form a transparent insulating layer (not shown).

Furthermore, it may further include the process of forming a phosphor layer on one surface of the semiconductor light-emitting element 150. For example, the semiconductor light-emitting element 150 may be a blue semiconductor light-emitting element for emitting blue (B) light, and red or green phosphor for converting the blue (B) light into the color of the sub-pixel may form a layer on one surface of the blue semiconductor light-emitting element.

The manufacturing method or structure of a display device using the foregoing semiconductor light-emitting element may be modified in various forms. For such an example, the foregoing display device may be applicable to a vertical semiconductor light-emitting element. Hereinafter, the vertical structure will be described with reference to FIGS. 5 and 6.

Furthermore, according to the following modified example or embodiment, the same or similar reference numerals are designated to the same or similar configurations to the foregoing example, and the description thereof will be substituted by the earlier description.

Figure 7:
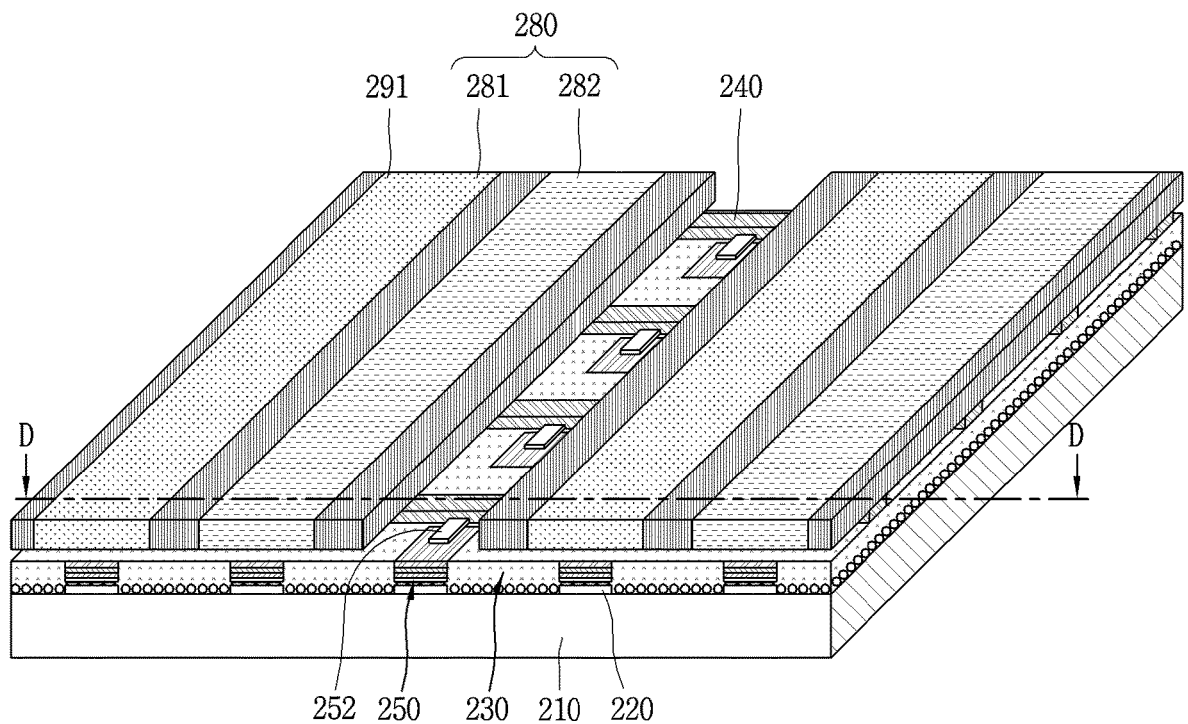
FIG. 7 is a perspective view showing a display device using a semiconductor light-emitting element according to another embodiment of the present disclosure.
Figure 8:
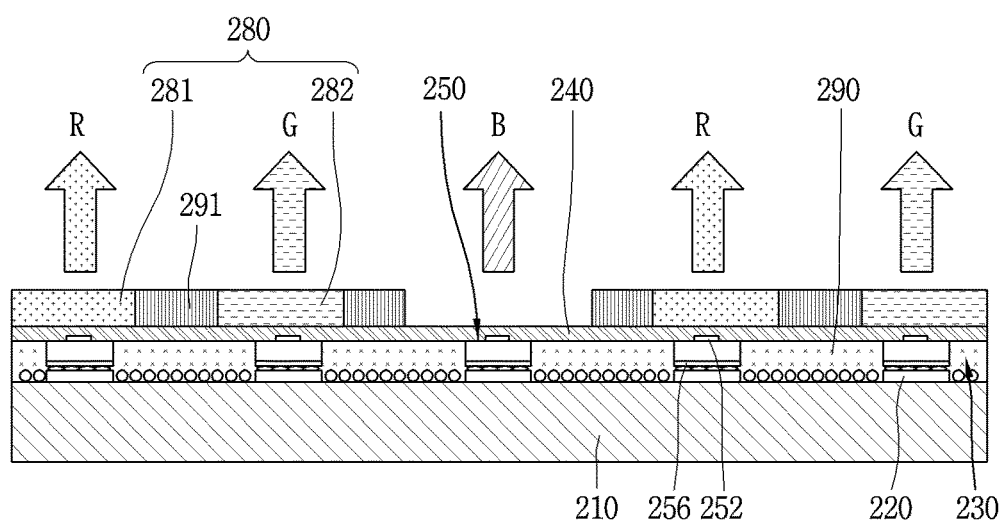
FIG. 8 is a cross-sectional view taken along line D-D in FIG. 7.
Figure 9:
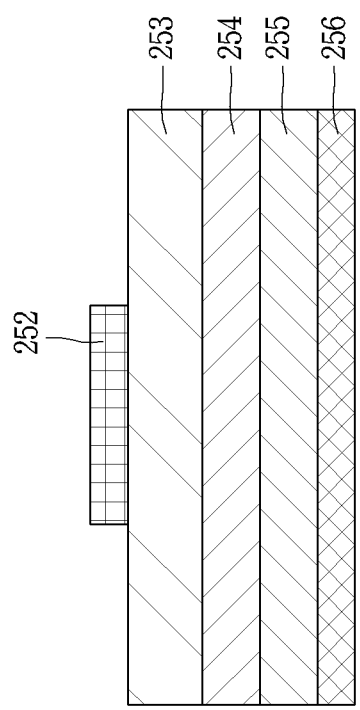
FIG. 9 is a conceptual view showing a vertical semiconductor light-emitting element in FIG. 8.

FIG. 7 is a perspective view illustrating a display device using a semiconductor light-emitting element according to another embodiment of the present disclosure. FIG. 8 is a cross-sectional view taken along line C-C in FIG. 7, and FIG. 9 is a conceptual view illustrating a vertical type semiconductor light-emitting element in FIG. 8.

According to the drawings, the display device may be display device using a passive matrix (PM) type of vertical semiconductor light-emitting element.

The display device may include a substrate 210, a first electrode 220, a conductive adhesive layer 230, a second electrode 240 and a plurality of semiconductor light-emitting elements 250.

The substrate 210 as a wiring substrate disposed with the first electrode 220 may include polyimide (PI) to implement a flexible display device. In addition, any one may be used if it is an insulating and flexible material.

The first electrode 220 may be located on the substrate 210, and formed with a bar-shaped electrode elongated in one direction. The first electrode 220 may be formed to perform the role of a data electrode.

The conductive adhesive layer 230 is formed on the substrate 210 located with the first electrode 220. Similar to a display device to which a flip chip type light-emitting element is applied, the conductive adhesive layer 230 may be an anisotropic conductive film (ACF), an anisotropic conductive paste, a solution containing conductive particles, and the like. However, the present embodiment illustrates a case where the conductive adhesive layer 230 is implemented by an anisotropic conductive film.

When an anisotropic conductive film is located in a state that the first electrode 220 is located on the substrate 210, and then heat and pressure are applied to connect the semiconductor light-emitting element 250 thereto, the semiconductor light-emitting element 250 is electrically connected to the first electrode 220. At this time, the semiconductor light-emitting element 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion 231 having conductivity and a portion 232 having no conductivity in the thickness direction thereof.

Furthermore, the anisotropic conductive film contains an adhesive component, and thus the conductive adhesive layer 230 implements a mechanical coupling as well as an electrical coupling between the semiconductor light-emitting element 250 and the first electrode 220.

In this manner, the semiconductor light-emitting element 250 is placed on the conductive adhesive layer 230, thereby configuring a separate sub-pixel in the display device. The semiconductor light-emitting element 250 may have excellent luminance characteristics, and thus it may be possible to configure individual sub-pixels even with a small size thereof. The size of the individual semiconductor light-emitting element 250 may be less than 80 μm in the length of one side thereof, and formed with a rectangular or square shaped element. In case of a rectangular shaped element, the size thereof may be less than 20×80 μm.

The semiconductor light-emitting element 250 may be a vertical structure.

A plurality of second electrodes 240 disposed in a direction of crossing the length direction of the first electrode 220, and electrically connected to the vertical semiconductor light-emitting element 250 may be located between vertical semiconductor light-emitting elements.

Referring to FIG. 9, the vertical semiconductor light-emitting element may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light-emitting element 250, thereby providing a great advantage capable of reducing the chip size.

Referring again to FIG. 8, a phosphor layer 280 may be formed on one surface of the semiconductor light-emitting element 250. For example, the semiconductor light-emitting element 250 is a blue semiconductor light-emitting element 251 that emits blue (B) light, and the phosphor layer 280 for converting the blue (B) light into the color of the sub-pixel may be provided thereon. In this case, the phosphor layer 280 may be a red phosphor 281 and a green phosphor 282 constituting individual pixels.

In other words, a red phosphor 281 capable of converting blue light into red (R) light may be deposited on the blue semiconductor light-emitting element 251 at a position implementing a red sub-pixel, and a green phosphor 282 capable of converting blue light into green (G) light may be deposited on the blue semiconductor light-emitting element 251 at a position implementing a green sub-pixel. Furthermore, only the blue semiconductor light-emitting element 251 may be solely used at a location implementing a blue sub-pixel. In this case, the red (R), green (G) and blue (B) sub-pixels may implement one pixel.

However, the present disclosure may not be necessarily limited to this, and another structure for implementing blue, red and green may be also applicable thereto as described above in a display device to which a flip chip type light-emitting element is applied.

Taking the present embodiment into consideration again, the second electrode 240 is located between the semiconductor light-emitting elements 250, and electrically connected to the semiconductor light-emitting elements 250. For example, the semiconductor light-emitting elements 250 may be disposed in a plurality of rows, and the second electrode 240 may be located between the rows of the semiconductor light-emitting elements 250.

Since a distance between the semiconductor light-emitting elements 250 constituting individual pixels is sufficiently large, the second electrode 240 may be located between the semiconductor light-emitting elements 250.

The second electrode 240 may be formed with a bar-shaped electrode elongated in one direction, and disposed in a perpendicular direction to the first electrode.

Furthermore, the second electrode 240 may be electrically connected to the semiconductor light-emitting element 250 by a connecting electrode protruded from the second electrode 240. More specifically, the connecting electrode may be an n-type electrode of the semiconductor light-emitting element 250. For example, the n-type electrode is formed with an ohmic electrode for ohmic contact, and the second electrode covers at least part of the ohmic electrode by printing or deposition. Through this, the second electrode 240 may be electrically connected to the n-type electrode of the semiconductor light-emitting element 250.

According to the drawing, the second electrode 240 may be located on the conductive adhesive layer 230. According to circumstances, a transparent insulating layer (not shown) containing silicon oxide (SiOx) may be formed on the substrate 210 formed with the semiconductor light-emitting element 250. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light-emitting element 250, the ITO material has a problem of bad adhesiveness with an n-type semiconductor. Accordingly, the second electrode 240 may be placed between the semiconductor light-emitting elements 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 may be formed between the semiconductor light-emitting elements 250. In other words, the partition wall 290 may be disposed between the vertical semiconductor light-emitting elements 250 to isolate the semiconductor light-emitting element 250 constituting individual pixels. In this case, the partition wall 290 may perform the role of dividing individual sub-pixels from one another, and be formed as an integral body with the conductive adhesive layer 230. For example, a base member of the anisotropic conductive film may form the partition wall when the semiconductor light-emitting element 250 is inserted into the anisotropic conductive film.

Furthermore, when the base member of the anisotropic conductive film is black, the partition wall 290 may have reflective characteristics while at the same time increasing contrast with no additional black insulator.

For another example, a reflective partition wall may be separately provided with the partition wall 290. The partition wall 290 may include a black or white insulator according to the purpose of the display device.

If the second electrode 240 is precisely located on the conductive adhesive layer 230 between the semiconductor light-emitting elements 250, the partition wall 290 may be located between the vertical semiconductor light-emitting element 250 and second electrode 240. Accordingly, individual sub-pixels may be configured even with a small size using the semiconductor light-emitting element 250, and a distance between the semiconductor light-emitting elements 250 may be relatively sufficiently large to place the second electrode 240 between the semiconductor light-emitting elements 250, thereby having the effect of implementing a flexible display device having a HD image quality.

Furthermore, according to the drawing, a black matrix 291 may be disposed between each phosphor layer to enhance contrast. In other words, the black matrix 291 can enhance the contrast of luminance.

In this manner, the semiconductor light-emitting element 250 is placed on the conductive adhesive layer 230, thereby configuring a separate sub-pixel in the display device. The semiconductor light-emitting element 250 has an excellent luminance characteristic, and thus it may be possible to configure individual sub-pixels even with a small size thereof. As a result, it may be possible to implement a full color display in which the sub-pixels of red (R), green (G) and blue (B) implement one pixel by means of the semiconductor light-emitting element.

Figure 10:
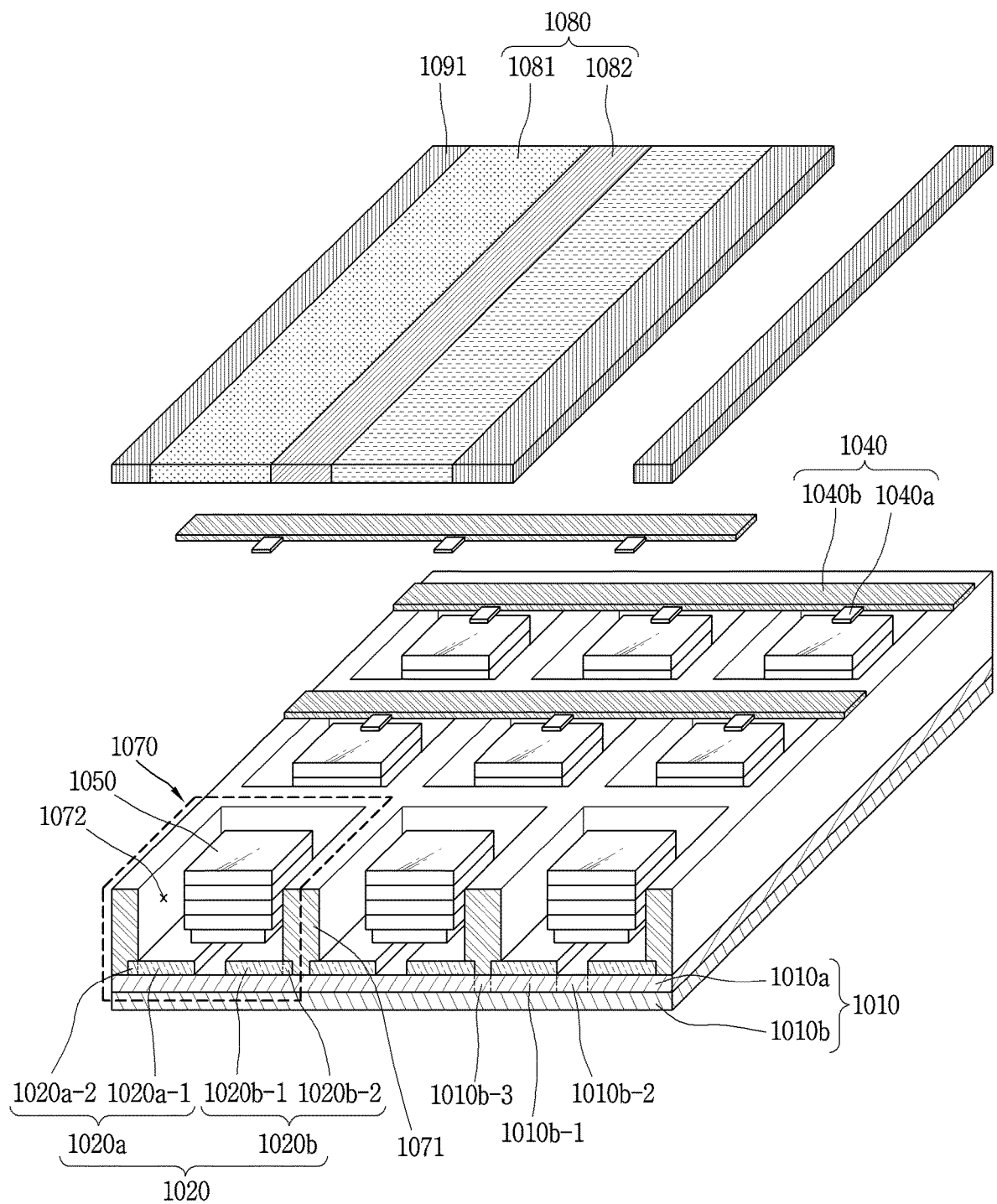
FIGS. 10 and 11 are conceptual views for explaining a display device having a new structure according to the present disclosure.
Figure 11:
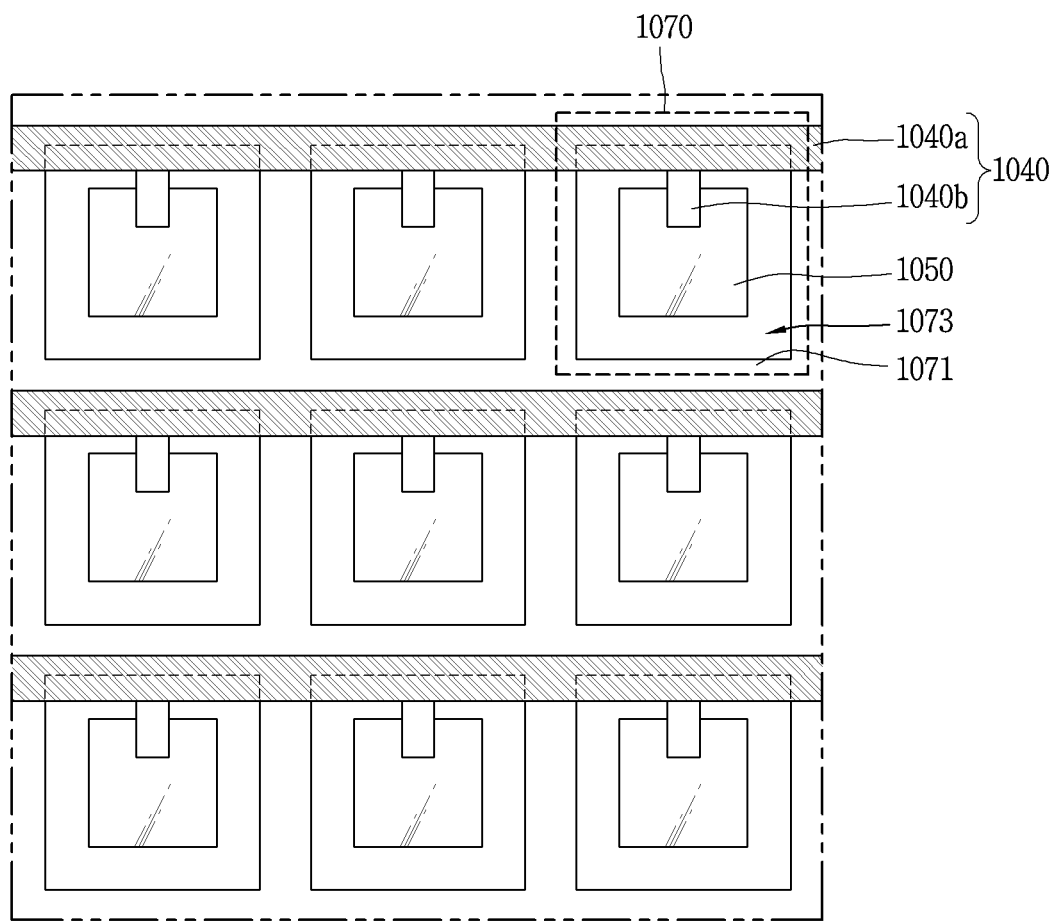
Figure 12:
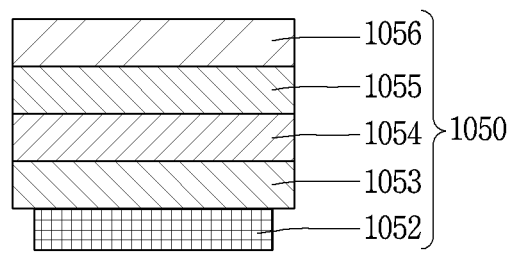
FIG. 12 is a conceptual view for explaining a semiconductor light-emitting element according to the present disclosure.

Hereinafter, a display device using a semiconductor light-emitting element according to the present disclosure will be described in more detail with reference to the accompanying drawings. FIGS. 10 and 11 are conceptual views for explaining a display device having a new structure according to the present disclosure, and FIG. 12 is a conceptual view for explaining a semiconductor light-emitting element according to the present disclosure.

According to the drawings in FIGS. 10 and 11, there is illustrated a display device 1000 using a passive matrix (PM) type vertical semiconductor light-emitting element as a display device 1000 using a semiconductor light-emitting element. However, an example described below may also be applicable to an active matrix (AM) type semiconductor light-emitting element.

The display device 1000 may include a substrate 1010, a first electrode 1020, a plurality of semiconductor light-emitting elements 1050, cells 1070 accommodating the plurality of semiconductor light-emitting elements 1050, and a second electrode 1040. Here, the first electrode 1020 and the second electrode 1040 may respectively include a plurality of electrode lines.

The substrate 1010 as a wiring substrate disposed with the first electrode 1020 may include polyimide (PI) to implement a flexible display device. In addition, it may be implemented as a non-flexible display or a signage, and thus any insulating and flexible material may be used for the substrate 1010

On the other hand, as illustrated, the substrate 1010 may further include a dielectric layer 1010a allowing the first electrode 1020 to form an electric field with an external electrode (or a third electrode (not shown) included on the substrate).

The dielectric layer 1010a is made of an inorganic material such as SiO2, SiNx, SiON, Al2O3, TiO2, HfO2, or the like.

Alternatively, the dielectric layer 1010a may be composed of a single layer or multiple layers as an organic insulator. A thickness of the dielectric layer 1010a may be several tens of nanometers to several micrometers.

Furthermore, the substrate may further include a base substrate 1010b that is deposited with the dielectric layer 1010a. In this case, the base substrate 1010b may be made of an insulating material.

In addition, the display device according to the present disclosure may include a plurality of cells 1070 having partition walls 1071 protruding on the substrate 1010. The cells 1070 are sequentially arranged along one direction to form a matrix structure as illustrated.

The cells 1070 may be made of a polymer material, and at least part thereof is made to cover part of the first electrode 1020. Furthermore, the partition wall forming the cells 1070 is made to be shared with neighboring cells.

An inside of the cells 1070 is provided with a hole 1072 accommodating the semiconductor light-emitting element 1050, as illustrated, and the shape of the hole 1072 may be the same or similar to that of the semiconductor light-emitting element 1050. When the semiconductor light-emitting element 1050 has a rectangular shape as illustrated, the hole 1072 may have a rectangular shape. In addition, although not shown, when the semiconductor light-emitting element has a circular shape, the hole 1072 formed inside the cells 1070 may be formed in a circular shape.

Moreover, each of the cells is configured to accommodate a single semiconductor light-emitting element 1050. In other words, a single semiconductor light-emitting element is accommodated in a single cell. The size of the hole 1072 formed inside the cells 1070 may be the same as that of the semiconductor light-emitting element or may be larger than that of the size of the semiconductor light-emitting element within 20% to allow a single semiconductor light-emitting element to be seated in each cell.

Meanwhile, the first electrode 1020 includes a plurality of electrode lines 1020*a*, 1020*b* disposed on the bottom of each cell, and is electrically connected to the semiconductor light-emitting element 1050. A plurality of electrode lines constituting the first electrode 1020 may be formed to extend to neighboring cells.

As illustrated, one semiconductor light-emitting element 1050 is electrically connected to a plurality of electrode lines 1020*a*, 1020*b*.

Furthermore, the plurality of electrode lines 1020*a*, 1020*b* are arranged to be spaced apart from each other.

The plurality of electrode lines 1020*a* 1020*b* are arranged on the dielectric layer 1010*a*. At least part of the partition wall 1071 may be deposited on at least part 1020*a*-2, 1020*b*-2 of the plurality of electrode lines 1020*a*, 1020*b*.

In other words, the partition wall 1071 provided in the cells 1070 may be formed to cover at least part 1020*a*-2, 1020*b*-2 of the first electrode 1020 disposed in each of the cells.

In addition, the semiconductor light-emitting element 1050 may be disposed on the remaining part of 1020*a*-1, 1020*b*-1 of the first electrode 1020.

Meanwhile, the bottom of each of the cells 1070 has a first region 1010*b*-1 covered by the plurality of electrode lines 1020*a*, 1020*b*, and a second region 1010*b*-2 formed between the plurality of electrode lines 1020*a*, 1020*b*, by the plurality of electrode lines 1020*a*, 1020*b*. Furthermore, the cells 1070 may further include a third region 1010*b*-3 covered by the partition wall 1071.

As such, at least part of the partition 1071 is formed to cover at least part of the first electrode 1020, and the remaining part of the partition 1071 may be formed to cover the dielectric layer 1010*a*.

In a display device having the foregoing structure, an electric field is formed between the first electrode 1020 and an external electrode through the second region 1010*b*-2 formed inside the cells, allowing the semiconductor light-emitting element 1050 to be inserted into the cells.

As illustrated, the second region 1010*b*-2 includes at least one slit, and the at least one slit is partitioned by the plurality of electrode lines 1020*a*, 1020*b* provided in the first electrode 1020.

In the illustration, a case where there are two electrode lines disposed inside the cell is taken as an example, so the number of slits is shown as one. However, when there are three electrode lines arranged to be spaced apart from one another in the cell, the number of slits may be two.

As such, the number of slits may be a value obtained by subtracting one from the number (n) of electrode lines arranged to be spaced apart from one another in the cell.

On the other hand, a conductive electrode formed on the semiconductor light-emitting element 1050 may be is guided to be located inside each of the cells by an electric field formed between the first electrode 1020 and the external electrode (or a third electrode (not shown) included on the substrate) and an attraction force formed thereon. As such, an electric field may be formed inside each of the cells by the partition wall.

The semiconductor light-emitting element is accommodated in the cells by an electric field formed by the first electrode and the external electrode.

Meanwhile, the external electrode described above may be deposited to exist under the dielectric layer 1010*a* in the process (or transfer process) of placing the semiconductor light-emitting element on the substrate 1010. Furthermore, when the transfer of the semiconductor light-emitting element is completed, the external electrode may be removed from the substrate.

Figure 13:
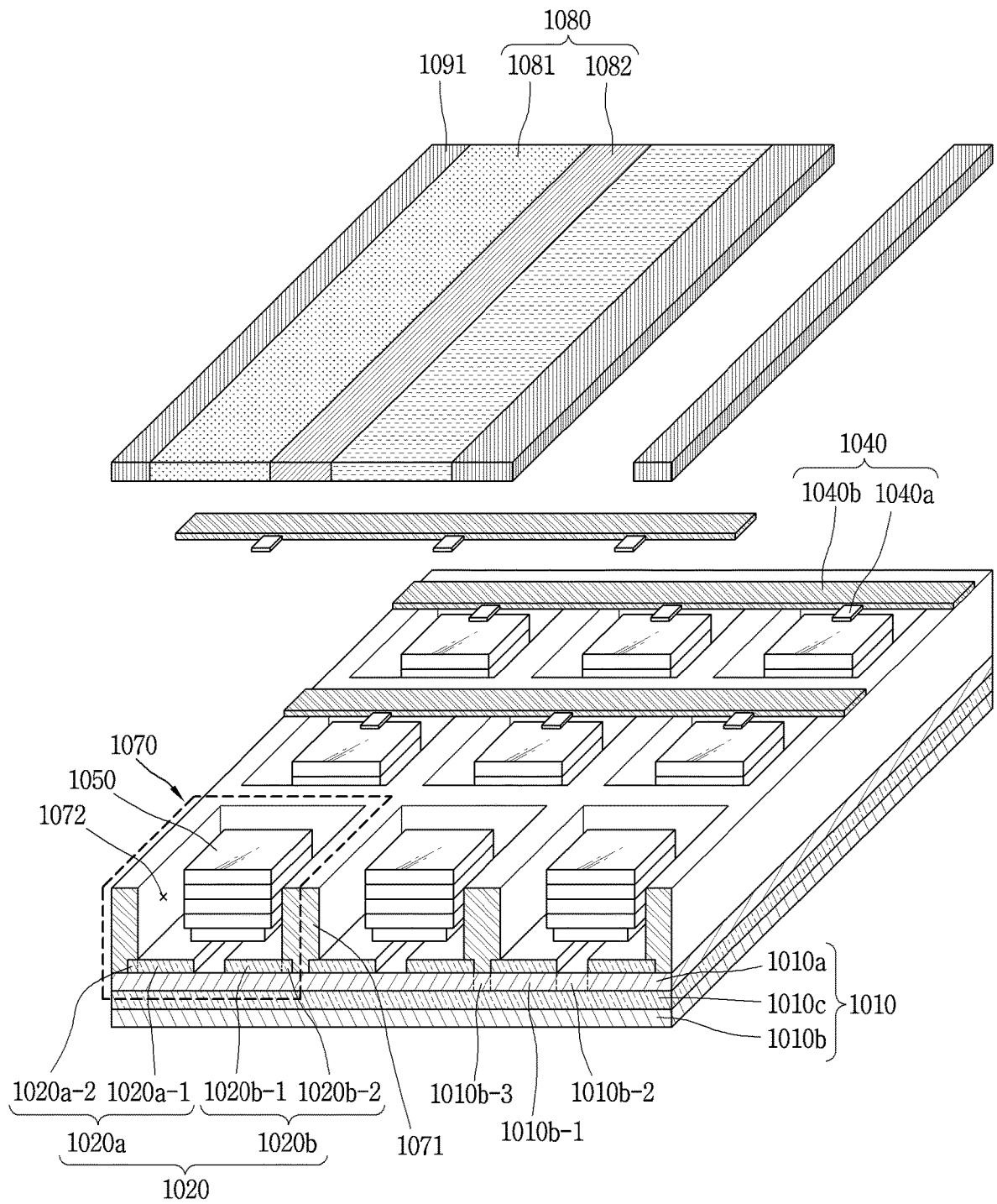
FIGS. 13, 14A, 14B and 15 are conceptual views for explaining a display device according to another example.

In addition, on the contrary, the external electrode may exist even when the transfer of the semiconductor light-emitting element is completed. In this case, the external electrode may be located between the dielectric layer 1010*a* and the base substrate 1010*b*, as illustrated in FIG. 13. This will be described in more detail later.

On the other hand, as illustrated in FIG. 12, the semiconductor light-emitting element according to the present disclosure includes a first conductive electrode 1052, a first conductive semiconductor layer 1053 formed with the first conductive electrode 1052, an active layer 1054 formed on the first conductive semiconductor layer 1053, a second conductive semiconductor layer 1055 formed on the active layer 1054, and a second conductive electrode 1056 formed on the second conductive semiconductor layer 1055.

The first conductive semiconductor layer 1053 and the second conductive semiconductor layer 1055 overlap with each other, and the second conductive electrode 1056 is disposed on an upper surface of the second conductive semiconductor layer 1055, and the first conductive electrode 1052 is disposed on a lower surface of the first conductive semiconductor layer 1053. In this case, the upper surface of the second conductive semiconductor layer 1055 may be one surface of the second conductive semiconductor layer 1055 farthest from the first conductive semiconductor layer 1053, and the lower surface of the first conductive semiconductor layer 1053 may be one surface of the first conductive semiconductor layer 1053 farthest from the second conductive semiconductor layer 1055. As described above, the first conductive electrode 1052 and the second conductive electrode 1056 are disposed above and below the first conductive semiconductor layer 1053 and the second conductive semiconductor layer 1055, respectively, by interposing them therebetween.

More specifically, the first conductive electrode 1052 and the first conductive semiconductor layer 1053 may be a p-type electrode and a p-type semiconductor layer, respectively, and the second conductive electrode 1056 and the second conductive semiconductor layer 1055 may be an n-type electrode and an n-type semiconductor layer, respectively. In this case, the p-type electrode may be electrically connected to the first electrode 1020, and the n-type electrode may be electrically connected to the second electrode 1040. However, the present disclosure is not limited thereto, and the first conductive type may be n-type and the second conductive type may be p-type.

As described above, the first conductive electrode 1052 is disposed to face the first electrode 1020 to cover at least part of the plurality of electrode lines 1020*a*, 1020*b* constituting the first electrode 1020.

On the other hand, the second electrode 1040 extends in a direction crossing the first electrode, and is electrically connected to the second conductive electrode 1056 of the semiconductor light-emitting element.

As illustrated, the second electrode 1040 may include an electrode line 1040*b* and a connection electrode 1040*a* extending from the electrode line 1040*b* toward the semiconductor light-emitting element.

Furthermore, on the contrary, the second electrode 1040 may be composed of only an electrode line, and in this case, at least part of the second electrode 1040 is configured to cover at least part of the second conductive electrode 1056. Meanwhile, at least part of the second electrode 1040 may be formed of a transparent electrode.

In addition, an electrode line constituting the second electrode 1040 may be formed to cover at least part of the partition wall 1071, as illustrated.

As illustrated, a plurality of second electrodes 1040 disposed in a direction of crossing the length direction of the first electrode 1020, and electrically connected to the semiconductor light-emitting element 1050 may be located between the semiconductor light-emitting elements.

On the other hand, as illustrated in FIG. 11, an insulating material 1073 may be filled into the cell 1070. In other words, the insulating material 1073 may be located between the partition wall 1071 and the semiconductor light-emitting element 1050.

Meanwhile, a height of the partition wall 1071 and a height of the semiconductor light-emitting element 1050 disposed on the wiring substrate 1050 may be the same. This is to allow the arrangement of the electrode line 1040b constituting the second electrode 1040.

Moreover, the display device 1000 may further include a phosphor layer 1080 formed on a surface of the plurality of semiconductor light-emitting elements 1050. For example, the semiconductor light-emitting element 1050 is a blue semiconductor light-emitting element that emits blue (B) light, and the phosphor layer 1080 performs the role of converting the blue (B) light into the color of a sub-pixel. The phosphor layer 1080 may be a red phosphor layer 1081 or green phosphor layer 1082 constituting individual pixels. In other words, a red phosphor 1081 capable of converting blue light into red (R) light may be deposited on the blue semiconductor light-emitting element at a position implementing a red sub-pixel, and a green phosphor 1082 capable of converting blue light into green (G) light may be deposited on the blue semiconductor light-emitting element at a position implementing a green sub-pixel. Furthermore, only the blue semiconductor light-emitting element may be solely used at a portion constituting a blue sub-pixel. In this case, the red (R), green (G) and blue (B) sub-pixels may implement one pixel. More specifically, one color phosphor may be deposited along a line constituting the first electrode 1020. On the cells, a phosphor corresponding to the same color may be deposited on the basis of cells arranged along a direction in which the electrode line constituting the first electrode extends. A phosphor layer corresponding to one color are disposed in cells constituting a column in a direction in which the first electrode extends. On the other hand, semiconductor light-emitting elements corresponding to red (R), green (G) and blue (B) may be sequentially disposed along the second electrode 1040 in a direction in which the second electrode 1040 extends, thereby implementing sub-pixels. However, the present disclosure may not be necessarily limited to this, and the semiconductor light-emitting element 1050 may be combined with a quantum dot (QD) instead of a phosphor to implement sub-pixels that emit red (R), green (G) and blue (B).

On the other hand, in order to improve the contrast of the phosphor layer 1080, the display device may further include a black matrix 1091 disposed between each phosphor. The black matrix 1091 may be formed in such a manner that a gap is formed between the phosphor dots and a black material fills the gap. Through this, the black matrix 1091 may improve contrast between light and dark while absorbing external light reflection.

The black matrix 1091 is located between respective phosphor layers along the first electrode 1020 in a direction in which the phosphor layers 1080 are deposited. In this case, a phosphor layer may not be formed at a position corresponding to the blue semiconductor light-emitting element 1051, but the black matrix 1091 may be respectively formed at both sides thereof with a space that does not have the phosphor layer (or with the blue light-emitting element 1051 therebetween).

As described above, a display device according to the present disclosure may efficiently transfer a semiconductor light-emitting element onto a wiring substrate through a structure including a cell accommodating the semiconductor light-emitting element and a plurality of electrode lines provided in each cell.

In the above, the structure in which an external electrode is not included on a wiring substrate has been described. The present disclosure uses an electric field formed between the external electrode and the first electrode 1020 provided on the wiring substrate in order to transfer the semiconductor light-emitting element to the wiring substrate. In this case, the external electrode may be used in the process of transferring the semiconductor light-emitting element, as described in the previous embodiments, and may be removed and not present in the final display device. In this case, the wiring substrate may include a dielectric layer 1010a and a base substrate 1010b.

Furthermore, in the present disclosure, even when the semiconductor light-emitting element is transferred to the wiring board, the external electrode may be used as an additional electrode by placing the external electrode as it is on the wiring substrate. Hereinafter, with reference to the accompanying drawings, a display device including a third electrode, which is an external electrode, will be described in more detail with reference to the accompanying drawings. FIGS. 13, 14A, 14B and 15 are conceptual views for explaining a display device according to another example.

The substrate 1010 as a wiring substrate disposed with the first electrode 1020 may include polyimide (PI) to implement a flexible display device. In addition, it may be implemented as a non-flexible display or a signage, and thus any insulating and flexible material may be used for the substrate 1010

Meanwhile, as illustrated, the substrate 1010 may include a dielectric layer 1010a on which the first electrode 1020 is disposed, a base substrate 1010b overlapping the dielectric layer 1010a, and a third electrode 1010c disposed between the dielectric layer 1010a and the base substrate 1010b.

The dielectric layer 1010a is made of an inorganic material such as $SiO_2$, $SiN_x$, $SiON$, $Al_2O_3$, $TiO_2$, $HfO_2$, or the like.

Alternatively, the dielectric layer 1010a may be composed of a single layer or multiple layers as an organic insulator. A thickness of the dielectric layer 1010a may be several tens of nanometers to several micrometers.

The dielectric layer 1010a is disposed between the first electrode 1020a and the third electrode 1030c to serve as a passage for an electric field formed by the first electrode 1020a and the third electrode 1030c.

On the other hand, the electric field formed by the first electrode 1020a and the third electrode 1030c is formed by a voltage applied from the outside when transferring the semiconductor light-emitting element, and made to be insulated when the transfer of the semiconductor light-emitting element is completed.

Furthermore, the base substrate 1010b may be made of an insulating material.

In addition, the third electrode 1030c may be formed of a surface electrode, and in some cases, may be equal to or larger than the width of the dielectric layer.

In addition, the display device according to the present disclosure may include a plurality of cells 1070 having partition walls 1071 protruding on the substrate 1010. The cells 1070 are sequentially arranged along one direction to form a matrix structure as illustrated.

The cells 1070 may be made of a polymer material, and at least part thereof is made to cover part of the first electrode 1020. Furthermore, the partition wall forming the cells 1070 is made to be shared with neighboring cells.

An inside of the cells 1070 is provided with a hole 1072 accommodating the semiconductor light-emitting element 1050, as illustrated, and the shape of the hole 1072 may be the same or similar to that of the semiconductor light-emitting element 1050. When the semiconductor light-emitting element 1050 has a rectangular shape as illustrated, the hole 1072 may have a rectangular shape. In addition, although not shown, when the semiconductor light-emitting element has a circular shape, the hole 1072 formed inside the cells 1070 may be formed in a circular shape.

Moreover, each of the cells is configured to accommodate a single semiconductor light-emitting element 1050. In other words, a single semiconductor light-emitting element is accommodated in a single cell. The size of the hole 1072 formed inside the cells 1070 may be the same as that of the semiconductor light-emitting element or may be larger than that of the size of the semiconductor light-emitting element within 20% to allow a single semiconductor light-emitting element to be seated in each cell.

Meanwhile, the first electrode 1020 includes a plurality of electrode lines 1020a, 1020b disposed on the bottom of each cell, and is electrically connected to the semiconductor light-emitting element 1050. A plurality of electrode lines constituting the first electrode 1020 may be formed to extend to neighboring cells.

As illustrated, one semiconductor light-emitting element 1050 is electrically connected to a plurality of electrode lines 1020a, 1020b.

Figure 14A:
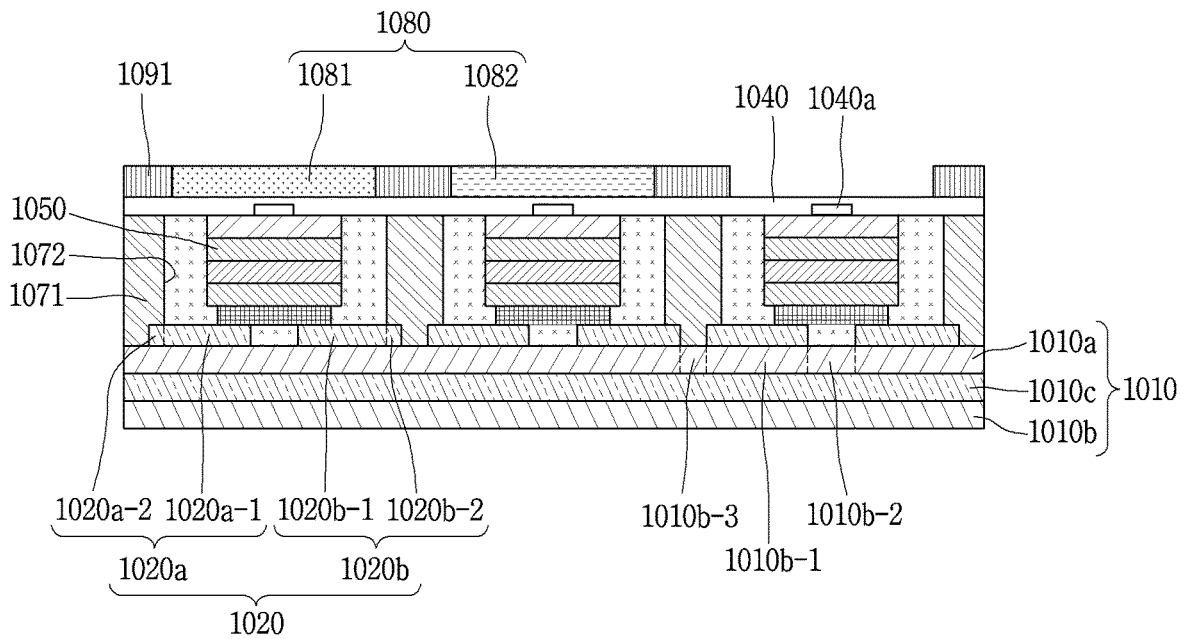

In addition, as illustrated in FIG. 14A, the plurality of electrode lines 1020a, 1020b are arranged to be spaced apart from each other.

The plurality of electrode lines 1020a 1020b are arranged on the dielectric layer 1010a. At least part of the partition wall 1071 may be deposited on at least part 1020a-2, 1020b-2 of the plurality of electrode lines 1020a, 1020b.

In other words, the partition wall 1071 provided in the cells 1070 may be formed to cover at least part 1020a-2, 1020b-2 of the first electrode 1020 disposed in each of the cells.

In addition, the semiconductor light-emitting element 1050 may be disposed on the remaining part of 1020a-1, 1020b-1 of the first electrode 1020.

Meanwhile, the bottom of each of the cells 1070 has a first region 1010b-1 covered by the plurality of electrode lines 1020a, 1020b, and a second region 1010b-2 formed between the plurality of electrode lines 1020a, 1020b, by the plurality of electrode lines 1020a, 1020b. Furthermore, the cells 1070 may further include a third region 1010b-3 covered by the partition wall 1071.

As such, at least part of the partition 1071 is formed to cover at least part of the first electrode 1020, and the remaining part of the partition 1071 may be formed to cover the dielectric layer 1010a.

In a display device having the foregoing structure, an electric field is formed between the first electrode 1020 and the third electrode 1010c through the second region 1010b-2 formed inside the cells, allowing the semiconductor light-emitting element 1050 to be inserted into the cells.

As illustrated, the second region 1010b-2 includes at least one slit, and the at least one slit is partitioned by the plurality of electrode lines 1020a, 1020b provided in the first electrode 1020.

Figure 14B:
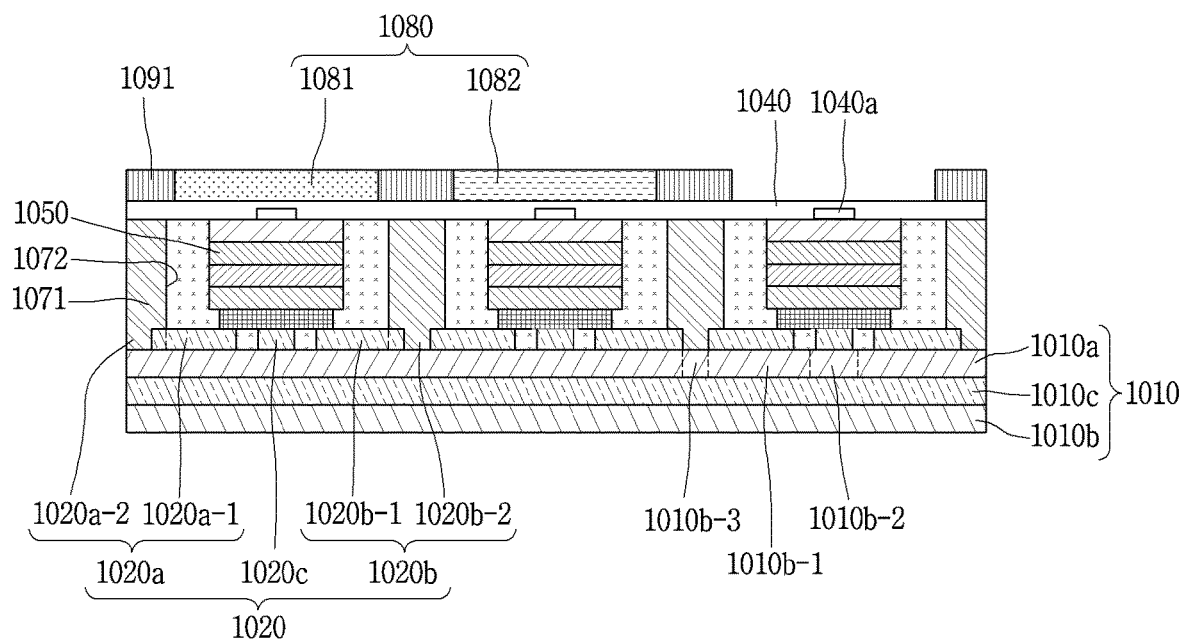

In FIG. 14A, a case where there are two electrode lines disposed inside the cell is taken as an example, so the number of slits is shown as one. However, as illustrated in FIG. 14B, when there are three electrode lines 1020a, 1020b, 1020c disposed to be spaced apart from one another in a cell, the number of slits may be two.

In other words, in a single cell, when the first electrode 1020 is composed of three electrode lines 1020a, 1020b, 1020c spaced apart from one another, the cell bottom may include two regions that are not covered by the electrode line, and these areas may be referred to as slits. As such, the number of slits may be a value obtained by subtracting one from the number (n) of electrode lines arranged to be spaced apart from one another in the cell.

On the other hand, a conductive electrode formed on the semiconductor light-emitting element 1050 may be is guided to be located inside each of the cells by an electric field formed between the first electrode 1020 and the third electrode 1010c and an attraction force formed thereon. As such, an electric field may be formed inside each of the cells by the partition wall.

The semiconductor light-emitting element is accommodated in the cells by an electric field formed by the first electrode and the external electrode.

On the other hand, as illustrated in FIG. 12, the semiconductor light-emitting element according to the present disclosure includes a first conductive electrode 1052, a first conductive semiconductor layer 1053 formed with the first conductive electrode 1052, an active layer 1054 formed on the first conductive semiconductor layer 1053, a second conductive semiconductor layer 1055 formed on the active layer 1054, and a second conductive electrode 1056 formed on the second conductive semiconductor layer 1055.

The first conductive semiconductor layer 1053 and the second conductive semiconductor layer 1055 overlap with each other, and the second conductive electrode 1056 is disposed on an upper surface of the second conductive semiconductor layer 1055, and the first conductive electrode 1052 is disposed on a lower surface of the first conductive semiconductor layer 1053. In this case, the upper surface of the second conductive semiconductor layer 1055 may be one surface of the second conductive semiconductor layer 1055 farthest from the first conductive semiconductor layer 1053, and the lower surface of the first conductive semiconductor layer 1053 may be one surface of the first conductive semiconductor layer 1053 farthest from the second conductive semiconductor layer 1055. As described above, the first conductive electrode 1052 and the second conductive electrode 1056 are disposed above and below the first conductive semiconductor layer 1053 and the second conductive semiconductor layer 1055, respectively, by interposing them therebetween.

More specifically, the first conductive electrode 1052 and the first conductive semiconductor layer 1053 may be a p-type electrode and a p-type semiconductor layer, respectively, and the second conductive electrode 1056 and the second conductive semiconductor layer 1055 may be an n-type electrode and an n-type semiconductor layer, respectively. In this case, the p-type electrode may be electrically connected to the first electrode 1020, and the n-type electrode may be electrically connected to the second electrode 1040. However, the present disclosure is not limited thereto, and the first conductive type may be n-type and the second conductive type may be p-type.

As described above, the first conductive electrode 1052 is disposed to face the first electrode 1020 to cover at least part of the plurality of electrode lines 1020a, 1020b constituting the first electrode 1020.

On the other hand, the second electrode 1040 extends in a direction crossing the first electrode, and is electrically connected to the second conductive electrode 1056 of the semiconductor light-emitting element.

As illustrated, the second electrode 1040 may include an electrode line 1040b and a connection electrode 1040a extending from the electrode line 1040b toward the semiconductor light-emitting element.

Furthermore, on the contrary, the second electrode 1040 may be composed of only an electrode line, and in this case, at least part of the second electrode 1040 is configured to cover at least part of the second conductive electrode 1056. Meanwhile, at least part of the second electrode 1040 may be formed of a transparent electrode.

In addition, an electrode line constituting the second electrode 1040 may be formed to cover at least part of the partition wall 1071, as illustrated.

As illustrated, a plurality of second electrodes 1040 disposed in a direction of crossing the length direction of the first electrode 1020, and electrically connected to the semiconductor light-emitting element 1050 may be located between the semiconductor light-emitting elements.

Figure 15:
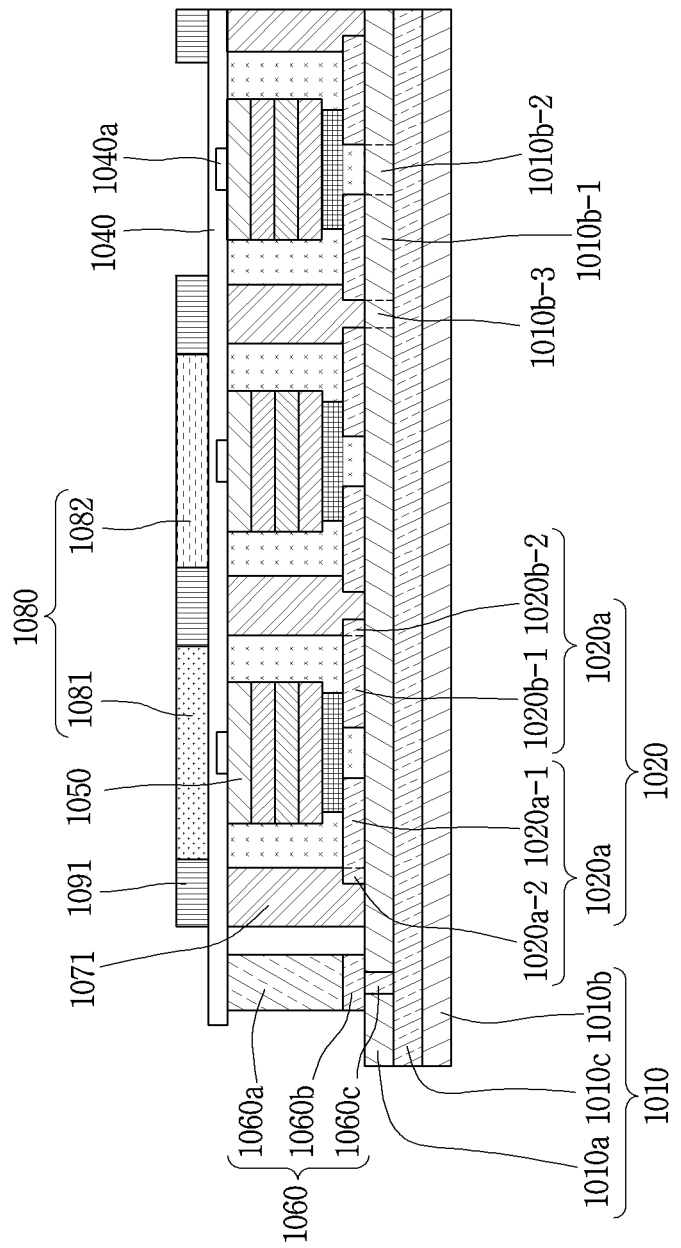

Meanwhile, as illustrated in FIG. 15, the second electrode may be electrically connected to the third electrode 1010c through an electrode connection portion 1060. As illustrated, the electrode connection portion 1060 includes first and second electrode pads 1060a, 1060b for adjusting a step difference with respect to the second electrode 1040, and further includes a via hole electrode 1060c allowing the second electrode 1040 to be electrically connected to the third electrode 1010c through a via hole formed in the dielectric layer 1010a.

Although not shown, the second electrode 1040 may be electrically connected to a driving driver through the third electrode 1010c by an electrical connection to the third electrode 1010c.

On the other hand, as illustrated in FIG. 11, an insulating material 1073 may be filled into the cell 1070. In other words, the insulating material 1073 may be located between the partition wall 1071 and the semiconductor light-emitting element 1050.

Meanwhile, a height of the partition wall 1071 and a height of the semiconductor light-emitting element 1050 disposed on the wiring substrate 1050 may be the same. This is to allow the arrangement of the electrode line 1040b constituting the second electrode 1040.

Moreover, the display device 1000 may further include a phosphor layer 1080 formed on a surface of the plurality of semiconductor light-emitting elements 1050. For example, the semiconductor light-emitting element 1050 is a blue semiconductor light-emitting element that emits blue (B) light, and the phosphor layer 1080 performs the role of converting the blue (B) light into the color of a sub-pixel. The phosphor layer 1080 may be a red phosphor layer 1081 or green phosphor layer 1082 constituting individual pixels. In other words, a red phosphor 1081 capable of converting blue light into red (R) light may be deposited on the blue semiconductor light-emitting element at a position implementing a red sub-pixel, and a green phosphor 1082 capable of converting blue light into green (G) light may be deposited on the blue semiconductor light-emitting element at a position implementing a green sub-pixel. Furthermore, only the blue semiconductor light-emitting element may be solely used at a portion constituting a blue sub-pixel. In this case, the red (R), green (G) and blue (B) sub-pixels may implement one pixel. More specifically, one color phosphor may be deposited along a line constituting the first electrode 1020. On the cells, a phosphor corresponding to the same color may be deposited on the basis of cells arranged along a direction in which the electrode line constituting the first electrode extends. A phosphor layer corresponding to one color are disposed in cells constituting a column in a direction in which the first electrode extends. On the other hand, semiconductor light-emitting elements corresponding to red (R), green (G) and blue (B) may be sequentially disposed along the second electrode 1040 in a direction in which the second electrode 1040 extends, thereby implementing sub-pixels. However, the present disclosure may not be necessarily limited to this, and the semiconductor light-emitting element 1050 may be combined with a quantum dot (QD) instead of a phosphor to implement sub-pixels that emit red (R), green (G) and blue (B).

On the other hand, in order to improve the contrast of the phosphor layer 1080, the display device may further include a black matrix 1091 disposed between each phosphor. The black matrix 1091 may be formed in such a manner that a gap is formed between the phosphor dots and a black material fills the gap. Through this, the black matrix 1091 may improve contrast between light and dark while absorbing external light reflection.

The black matrix 1091 is located between respective phosphor layers along the first electrode 1020 in a direction in which the phosphor layers 1080 are deposited. In this case, a phosphor layer may not be formed at a position corresponding to the blue semiconductor light-emitting element 1051, but the black matrices 1091 may be respectively formed at both sides thereof with a space that does not have the phosphor layer (or with the blue light-emitting element 1051 therebetween).

As described above, a display device according to the present disclosure may efficiently transfer a semiconductor light-emitting element onto a wiring substrate through a structure including a cell accommodating the semiconductor light-emitting element and a plurality of electrode lines provided in each cell.

Figure 16A:
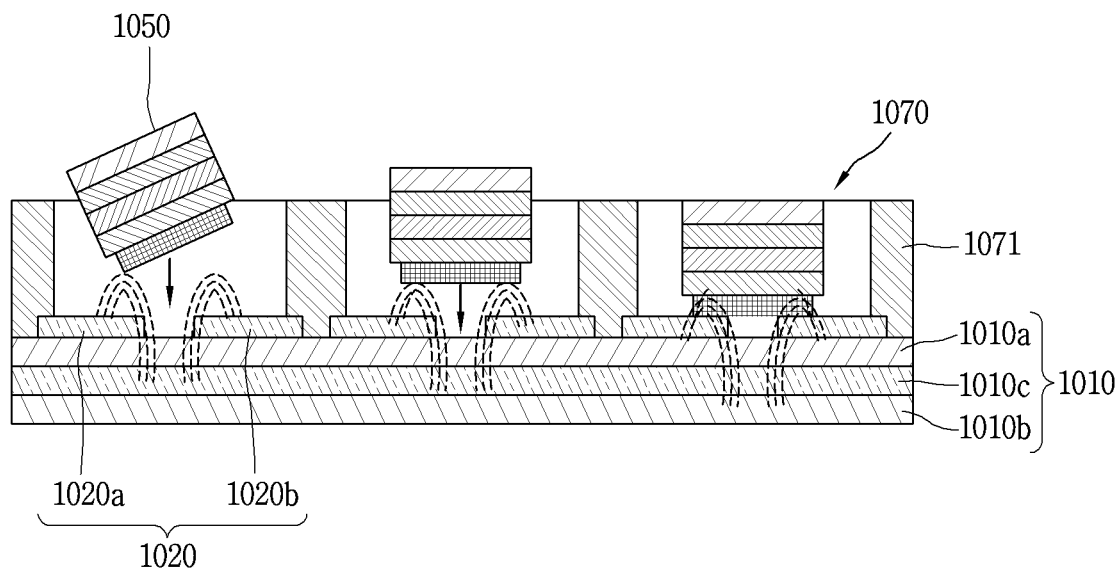
FIGS. 16A and 16B are conceptual views for explaining a process of transferring a semiconductor light-emitting element in a display device according to the present disclosure.
Figure 16B:
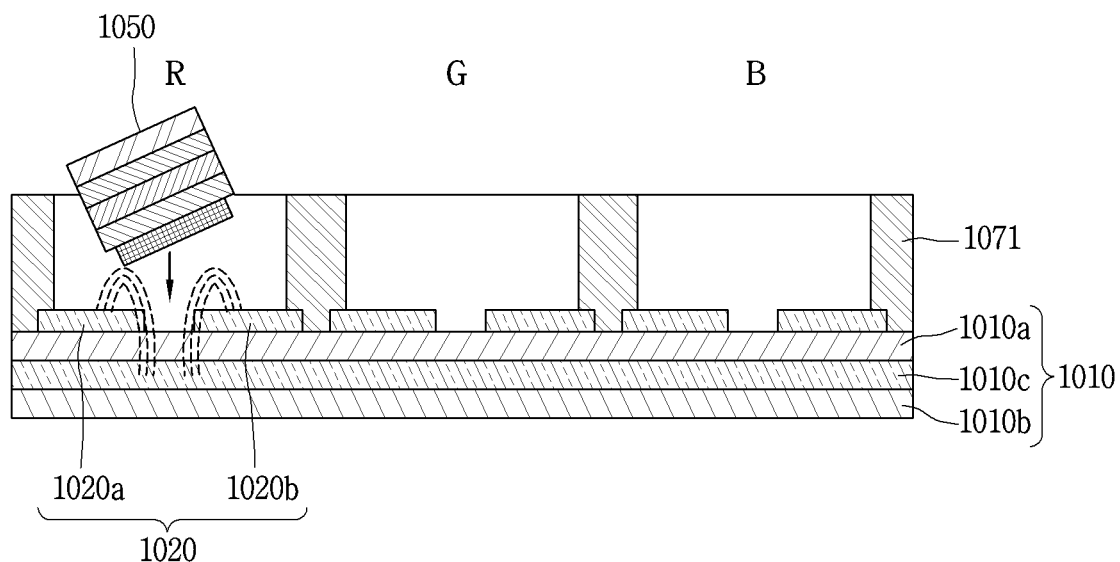

FIGS. 16A and 16B are conceptual views for explaining a process of transferring a semiconductor light-emitting element in a display device according to the present disclosure.

As illustrated in FIG. 16A, in a display device according to the present disclosure, the semiconductor light-emitting element 1050 may be accommodated in each cell 1070 through an electric field formed by the first electrode 1020a and the third electrode 1030c. Here, the electric field may be formed by applying a voltage between the first electrode 1020a and the third electrode 1030c.

Meanwhile, in a display device according to the present disclosure, as illustrated in FIG. 16B, the semiconductor light-emitting element may be selectively transferred. The semiconductor light-emitting elements corresponding to red, green, and blue, respectively, may be selectively transferred.

For example, in a display device according to the present disclosure, a voltage may by applied only to a first electrode formed at a position where a semiconductor light-emitting element corresponding to any one color of red, green, and blue is disposed, thereby forming an electric field only at the relevant electrode. In this case, the semiconductor light-emitting element may be disposed only at the position where the electric field is formed. As such, in a display device according to the present disclosure, a voltage may be applied to form an electric field only in a cell including an electrode corresponding to a position to be transferred, thereby transferring a semiconductor light-emitting element to a desired position.

As described above, a display device according to the present disclosure, a semiconductor light-emitting element may be assembled to on a wiring substrate using an electric field, thereby selectively assembling the semiconductor light-emitting elements corresponding to different colors without masking.

On the other hand, an electric field formed by the first electrode 1020a and the third electrode 1030c may be formed by a voltage applied from the outside when transferring a semiconductor light-emitting element, and the first electrode 1020a and the third electrode 1030c may made to be insulated from each other when the transfer of the semiconductor light-emitting element is completed.

On the other hand, in the above-described embodiment, it is illustrated that the shapes of the electrode lines of the first electrode included in each cell are arranged in parallel with each other, but the present disclosure may not be limited to those shapes, and may be extended in various ways.

In other words, the electrode lines of the first electrode may be arranged in various shapes to form a stronger electric field, and may be formed in various ways, such as a notch shape, a lattice shape, a circular shape, a wave shape, or the like.

Meanwhile, a cell according to the present disclosure may also be formed in the shape of a hole, and in this case, according to the present disclosure, a hole corresponding to a placement distance of the semiconductor light-emitting element may be formed on a polymer layer.

In addition, in a display device according to the present disclosure, the process of transferring the semiconductor light-emitting element to the wiring substrate may be performed in solution. This is to place the semiconductor light-emitting element into the cell by an electric field formed on the wiring substrate in the state of being suspended in the solution. At this time, according to a display device according to the present disclosure, the semiconductor light-emitting element located in the solution may be moved to the vicinity of the cell by various methods such as sliding, shaking, agitation, air flow, sound waves, and ultrasonic waves.

Meanwhile, the semiconductor light-emitting element is seated in the cell by a dielectric force or an electrostatic force.

In a display device according to the present disclosure, a semiconductor light-emitting element may be transferred using an electric field formed through a wiring electrode to assemble the semiconductor light-emitting element in place, thereby improving assembly efficiency.

Furthermore, in a display device according to the present disclosure, red, green, and blue semiconductor light-emitting elements may be selectively transferred using an electric field without an additional masking process, thereby improving transfer process efficiency.

What is claimed is:

1. A display device, comprising:
a substrate comprising a dielectric layer;
a plurality of cells provided with a partition wall protruding on the substrate, and sequentially arranged along one direction;
a plurality of semiconductor light-emitting devices respectively accommodated in the plurality of cells;
a first electrode provided with a plurality of electrode lines arranged on a bottom of the plurality of cells, and electrically connected to the plurality of semiconductor light-emitting devices; and
a third electrode provided on a lower surface of the dielectric layer,
wherein each of the first electrode comprises a pair of electrode lines spaced from each other on an upper surface of the dielectric layer among the plurality of electrode lines,
wherein each semiconductor light-emitting device is disposed on the pair of electrode lines, and
wherein the pair of electrode lines have the same electrical pole.

2. The display device of claim 1, wherein an electric field is formed in the plurality of cells through a second region between the plurality of electrode lines.

3. The display device of claim 2, wherein the second region is provided with at least one slit, and
wherein the at least one slit is partitioned by the plurality of electrode lines provided on the first electrode.

4. The display device of claim 1, wherein the partition wall provided in the plurality of cells is formed to cover at least part of the first electrode disposed in the plurality of cells.

5. The display device of claim 4, wherein the partition wall comprises a polymer material, and
wherein an electric field is formed inside the plurality of cells by the partition wall.

6. The display device of claim 4, wherein at least a part of the partition wall is formed to cover at least a part of the first electrode, and
wherein a remaining part other than the part of the partition wall is formed to cover the dielectric layer.

7. The display device of claim 1, wherein each of the plurality, of semiconductor light-emitting devices respectively accommodated in the plurality of cells comprises:
a first conductive electrode and a second conductive electrode;
a first conductive semiconductor layer on which the first conductive electrode is disposed;
a second conductive semiconductor layer that overlaps with the first conductive semiconductor layer, on which the second conductive electrode is disposed; and
an active layer disposed between the first and second conductive semiconductor layers, and
wherein the first conductive electrode is disposed to face the first electrode.

8. The display device of claim 7, wherein the plurality of semiconductor light-emitting devices are respectively accommodated in the plurality of cells by an electric field formed by the first electrode and the third electrode.

9. The display device of claim 7, further comprising:
a second electrode disposed on at least a part of the second conductive electrode, and formed with an electrode line extending in a direction crossing the first electrode.

10. The display device of claim 9, wherein a via hole passing through the dielectric layer is formed on one side of the substrate.

11. The display device of claim 10, wherein the second electrode and the second conductive electrode are electrically connected to the third electrode through the via hole.

12. The display device of claim 1, wherein an electric field is formed through the dielectric layer between the third electrode and the plurality of electrode lines arranged parallel in each cell of the plurality of cells.

13. The display device of claim 1, wherein the plurality of semiconductor light-emitting devices are separated from the partition wall by a gap.

14. The display device of claim 1, wherein the third electrode has an opposite electrical pole from that of the pair of electrode lines.

15. The display device of claim 1, wherein each of the pair of electrode lines has the same shape.

16. The display device of claim 1, wherein a level of a top surface of the partition wall is the same of a top surface of at least one of the plurality of semiconductor light emitting devices.

17. The display device of claim 1, wherein the third electrode is insulated from the first electrode.

18. The display device of claim 1, wherein the bottom of the plurality of cells comprises a first region covered by the plurality of electrode lines.

19. A display device, comprising:
- a plurality of cells provided on a substrate having a dielectric layer, and including partition walls to define one cell from another cell;
- a first electrode extending at bottoms of the plurality of cells from the one cell to the another cell;
- a plurality of semiconductor light-emitting devices respectively accommodated in the plurality of cells, and electrically connected to the first electrode; and
- a third electrode provided on a lower surface of the dielectric layer, wherein the partition walls partially overlap and cover the first electrode in each of the plurality of cells, wherein each of the first electrode comprises a pair of electrode lines spaced from each other on an upper surface of the dielectric layer, wherein each semiconductor light-emitting device is disposed on the pair of electrode lines, and wherein the pair of electrode lines have the same electrical pole.

20. The display device of claim 19, wherein the bottoms of the plurality of cells comprise a first region covered by the pair of electrode lines, and a second region formed between the pair of electrode lines, and wherein an electric field is formed through the dielectric layer between the third electrode and the pair of electrode lines arranged parallel in each cell of the plurality of cells.

21. The display device of claim 19, wherein the third electrode has an opposite electrical pole from that of the pair of electrode lines.

* * * * *